(12) United States Patent
Murata et al.

(10) Patent No.: US 11,285,697 B2
(45) Date of Patent: Mar. 29, 2022

(54) OPTICAL LAMINATE AND WAVELENGTH CONVERSION SHEET

(71) Applicant: TOPPAN PRINTING CO., LTD., Tokyo (JP)

(72) Inventors: Koji Murata, Tokyo (JP); Masayoshi Suzuta, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 222 days.

(21) Appl. No.: 16/502,504

(22) Filed: Jul. 3, 2019

(65) Prior Publication Data
US 2019/0329528 A1    Oct. 31, 2019

Related U.S. Application Data

(63) Continuation of application No. PCT/JP2017/046139, filed on Dec. 22, 2017.

(30) Foreign Application Priority Data

Jan. 5, 2017   (JP) .............................. JP2017-000432

(51) Int. Cl.
| | | |
|---|---|---|
| *B32B 7/12* | (2006.01) | |
| *B32B 27/08* | (2006.01) | |
| *B32B 27/16* | (2006.01) | |
| *B32B 27/20* | (2006.01) | |
| *B32B 27/36* | (2006.01) | |
| *B32B 27/18* | (2006.01) | |
| *C09K 11/02* | (2006.01) | |
| *F21K 9/64* | (2016.01) | |
| *C09D 4/00* | (2006.01) | |
| *C09D 133/00* | (2006.01) | |
| *C09D 175/12* | (2006.01) | |
| *C09D 163/00* | (2006.01) | |
| *C09D 181/00* | (2006.01) | |
| *C23C 4/10* | (2016.01) | |
| *G02B 5/20* | (2006.01) | |

(52) U.S. Cl.
CPC ................ *B32B 7/12* (2013.01); *B32B 27/08* (2013.01); *B32B 27/16* (2013.01); *B32B 27/20* (2013.01); *B32B 27/36* (2013.01); *C09D 4/00* (2013.01); *C09D 133/00* (2013.01); *C09D 163/00* (2013.01); *C09D 175/12* (2013.01); *C09D 181/00* (2013.01); *C09K 11/02* (2013.01); *F21K 9/64* (2016.08); *B32B 2255/10* (2013.01); *B32B 2255/20* (2013.01); *B32B 2255/26* (2013.01); *B32B 2551/00* (2013.01)

(58) Field of Classification Search
None
See application file for complete search history.

(56) References Cited

U.S. PATENT DOCUMENTS

| | | | | |
|---|---|---|---|---|
| 2011/0037926 A1* | 2/2011 | Tsukahara | ............ | G02B 6/0023 349/64 |
| 2013/0113008 A1* | 5/2013 | Shiobara | ............ | C09K 11/7721 257/98 |
| 2016/0327690 A1* | 11/2016 | Tokinoya | ............... | G02B 6/005 |

FOREIGN PATENT DOCUMENTS

| | | |
|---|---|---|
| JP | 2016-141051 A | 8/2016 |
| KR | 10-2013-0050250 A | 5/2013 |
| WO | WO-2014/113562 A1 | 7/2014 |

OTHER PUBLICATIONS

International Searching Authority, "International Search Report," issued in connection with International Patent Application No. PCT/JP2017/046139, dated Mar. 20, 2018.

International Searching Authority, "Written Opinion," issued in connection with International Patent Application No. PCT/JP2017/046139, dated Mar. 20, 2018.

Office Action dated Jan. 20, 2022 issued in a corresponding Korean Patent Application No. 10-2019-7019198, (4 pages).

* cited by examiner

*Primary Examiner* — Sheeba Ahmed
(74) *Attorney, Agent, or Firm* — Foley & Lardner LLP

(57) ABSTRACT

An optical laminate comprising an adherend including a curable resin, and a barrier film laminated on at least one surface of the adherend, wherein the barrier film comprises, on an outermost surface facing the adherend, a primer layer formed by curing a primer composition containing a silane coupling agent having a reactive functional group capable of reacting with the curable resin, other than an alkoxysilane group and a silanol group, and assuming that a thickness of the primer layer is D, a total content of the reactive functional group and the reactive functional group that has reacted with the curable resin per 1 m²×D of the primer layer is $1.5\times10^{-6}$ mol or higher and $3.5\times10^{-3}$ mol or lower.

6 Claims, 6 Drawing Sheets

OPTICAL LAMINATE AND WAVELENGTH CONVERSION SHEET

CROSS-REFERENCE TO RELATED PATENT APPLICATIONS

This application is a continuation application filed under 35 U.S.C. § 111(a) claiming the benefit under 35 U.S.C. § § 120 and 365(c) of International Patent Application No. PCT/JP2017/046139, filed on Dec. 22, 2017, which is based upon and claims the benefit of priority to and Japanese Patent Application No. 2017-000432, filed on Jan. 5, 2017; the disclosures of which are all incorporated herein by reference in their entireties.

TECHNICAL FIELD

The present invention relates to an optical laminate and a wavelength conversion sheet.

BACKGROUND ART

A wavelength conversion sheet comprising phosphors such as quantum dots has high luminance and color reproducibility, and its adoption in displays and the like is desired. However, phosphors such as quantum dots are degraded by contact with oxygen or moisture. Therefore, a wavelength conversion sheet often adopts the structure in which a barrier film, comprising a polymer film and a gas barrier layer formed thereon, is disposed on one surface or both surfaces of a phosphor layer comprising phosphors.

For example, in PTL 1, permeation of oxygen and the like to the phosphor layer is prevented by bonding a barrier film on each side of the phosphor layer comprising acrylic resin and epoxy resin that contain quantum dots dispersed therein.

CITATION LIST

[Patent Literature] [PTL 1] WO 2014/113562-A1

SUMMARY OF THE INVENTION

Technical Problem

However, a phosphor layer containing dispersed quantum dots of inorganic materials such as those described in PTL 1 has poor adhesion to the barrier film, and there is a risk of peeling between the phosphor layer and the barrier film. This problem does not apply only to wavelength conversion sheets, and peeling off of the barrier film in an optical laminate causes a great deterioration in performance, and therefore, it is required to improve the adhesion between the barrier film and the adherend.

The present invention has been made in view of the above-described problems of the related art, and an objective thereof is to provide an optical laminate and a wavelength conversion sheet that have good gas barrier properties and good adhesion between the barrier film and the adherend.

Solution to Problem

In order to achieve the above objective, the present invention provides an optical laminate comprising an adherend including a curable resin, and a barrier film laminated on at least one surface of the adherend, wherein the barrier film comprises, on an outermost surface facing the adherend, a primer layer formed by curing a primer composition containing a silane coupling agent having a reactive functional group capable of reacting with the curable resin, other than an alkoxysilane group and a silanol group, and assuming that a thickness of the primer layer is D, a total content of the reactive functional group and the reactive functional group that has reacted with the curable resin per 1 m2×D of the primer layer is 1.5×10-6 mol or higher and 3.5×10-3 mol or lower.

According to the above-described optical laminate, good adhesion between the barrier film and the adherend can be obtained by laminating the barrier film and the adherend via the primer layer formed by curing the primer composition containing the silane coupling agent having the reactive functional group. In particular, since the total content of the reactive functional group and the reactive functional group that has reacted with the curable resin per 1 m2×D (a volume that varies depending on the value of the thickness D) of the primer layer is 1.5×10-6 mol or higher and 3.5×10-3 mol or lower, better adhesion between the barrier film and the adherend can be obtained. When this content is lower than 1.5×10-6 mol, sufficient adhesion with the adherend cannot be obtained. On the other hand, when the content is higher than 3.5×10-3 mol, the functional group of the curable resin in the adherend for curing reacts excessively with the reactive functional group. As a result, curing of the curable resin is impeded and cohesion of the curable resin deteriorates, and therefore sufficient adhesion with the adherend cannot be obtained.

In addition, the silane coupling agent generates a silanol group in the primer layer by hydrolysis. Reaction between this silanol group with a polar functional group such as a hydroxyl group on the surface of another layer in the barrier film in contact with the primer layer contributes to the improvement of adhesion, and penetration of moisture, oxygen, and the like from the interface between the primer layer and the layer in contact therewith can be suppressed. From these characteristics, the above-described optical laminate has good gas barrier properties and good adhesion between the barrier film and the adherend, and peeling between the adherend and the barrier film can be prevented.

In the above-described optical laminate, the total content of the reactive functional group and the reactive functional group that has reacted with above curable resin per unit volume of the primer layer is preferably 1.5×10-3 mol/cm3 or higher and 7.0×10-3 mol/cm3 or lower. In this case, adhesion between the barrier film and the adherend can be further improved.

In the optical laminate, the curable resin is preferably a resin that can be cured with ultraviolet light and/or cured thermally. In this case, at the time the curable resin undergoes the curing reaction, the functional group of the curable resin and the reactive functional group of the primer layer react with each other to form a chemical bond, whereby firm adhesion can be obtained.

The present invention also provides a wavelength conversion sheet comprising a phosphor layer including a curable resin and a phosphor, and a barrier film laminated on at least one surface of the phosphor layer, wherein the barrier film comprises, on an outermost surface facing the phosphor layer, a primer layer formed by curing a primer composition containing a silane coupling agent having a reactive functional group capable of reacting with the curable resin other than an alkoxysilane group and a silanol group, and assuming that a thickness of the primer layer is D, a total content of the reactive functional group and the reactive functional group that has reacted with the curable resin per 1 m2×D of the primer layer is 1.5×10-6 mol or higher and 3.5×10-3 mol or lower.

According to the above-described wavelength conversion sheet, similarly to the optical laminate, good adhesion between the barrier film and the phosphor layer can be obtained by laminating the barrier film and the phosphor layer via the primer layer formed by curing the primer composition containing the silane coupling agent having the reactive functional group. In particular, since the total content of the reactive functional group and the reactive functional group that has reacted with the curable resin per 1 m2×D of the primer layer is 1.5×10-6 mol or higher and 3.5×10-3 mol or lower, better adhesion between the barrier film and the phosphor layer can be obtained. When this content is lower than 1.5×10-6 mol, sufficient adhesion with the phosphor layer cannot be obtained. On the other hand, when the content is higher than 3.5×10-3 mol, the functional group of the curable resin in the phosphor layer for curing reacts excessively with the reactive functional group. As a result, curing of the curable resin is impeded and cohesion of the curable resin deteriorates, and therefore sufficient adhesion with the phosphor layer cannot be obtained.

In addition, the silane coupling agent generates a silanol group in the primer layer by hydrolysis. Reaction between this silanol group with a polar functional group such as a hydroxyl group on the surface of another layer in the barrier film in contact with the primer layer contributes to the improvement of adhesion, and penetration of moisture, oxygen, and the like from the interface between the primer layer and the layer in contact therewith can be suppressed. From these characteristics, the above-described wavelength conversion sheet has good gas barrier properties and good adhesion between the barrier film and the phosphor layer, and peeling between the phosphor layer and the barrier film can be prevented.

In the above-described wavelength conversion sheet, the total content of the reactive functional group and the reactive functional group that has reacted with the above curable resin per unit volume of the primer layer is preferably 1.5×10-3 mol/cm3 or higher and 7.0×10-3 mol/cm3 or lower. In this case, the adhesion between the barrier film and the phosphor layer can be further improved.

In the wavelength conversion sheet, the curable resin may comprise an acrylic resin, and the reactive functional group may comprise at least one selected from the group consisting of a vinyl group, an acrylic group, a methacrylic group, and a mercapto group. In this case, at the time the curable resin undergoes the curing reaction, the functional group of the curable resin and the reactive functional group of the primer layer react with each other to form a chemical bond, whereby firm adhesion can be obtained.

In the wavelength conversion sheet, the curable resin may comprise an epoxy resin, and the reactive functional group may comprise at least one selected from the group consisting of an epoxy group, an amino group, and a mercapto group. In this case, at the time the curable resin undergoes the curing reaction, the functional group of the curable resin and the reactive functional group of the primer layer react with each other to form a chemical bond, whereby firm adhesion can be obtained.

In the wavelength conversion sheet, the curable resin may comprise a thiol resin, and the reactive functional group may comprise at least one selected from the group consisting of an epoxy group, a mercapto group, a vinyl group, and a methacrylic group. In this case, at the time the curable resin undergoes the curing reaction, the functional group of the curable resin and the reactive functional group of the primer layer react with each other to form a chemical bond, whereby firm adhesion can be obtained.

Advantageous Effect of the Invention

According to the present invention, an optical laminate and a wavelength conversion sheet that have good gas barrier properties and good adhesion between the barrier film and the adherend can be provided.

DETAILED DESCRIPTION OF REPRESENTATIVE EMBODIMENTS

Figure 1:
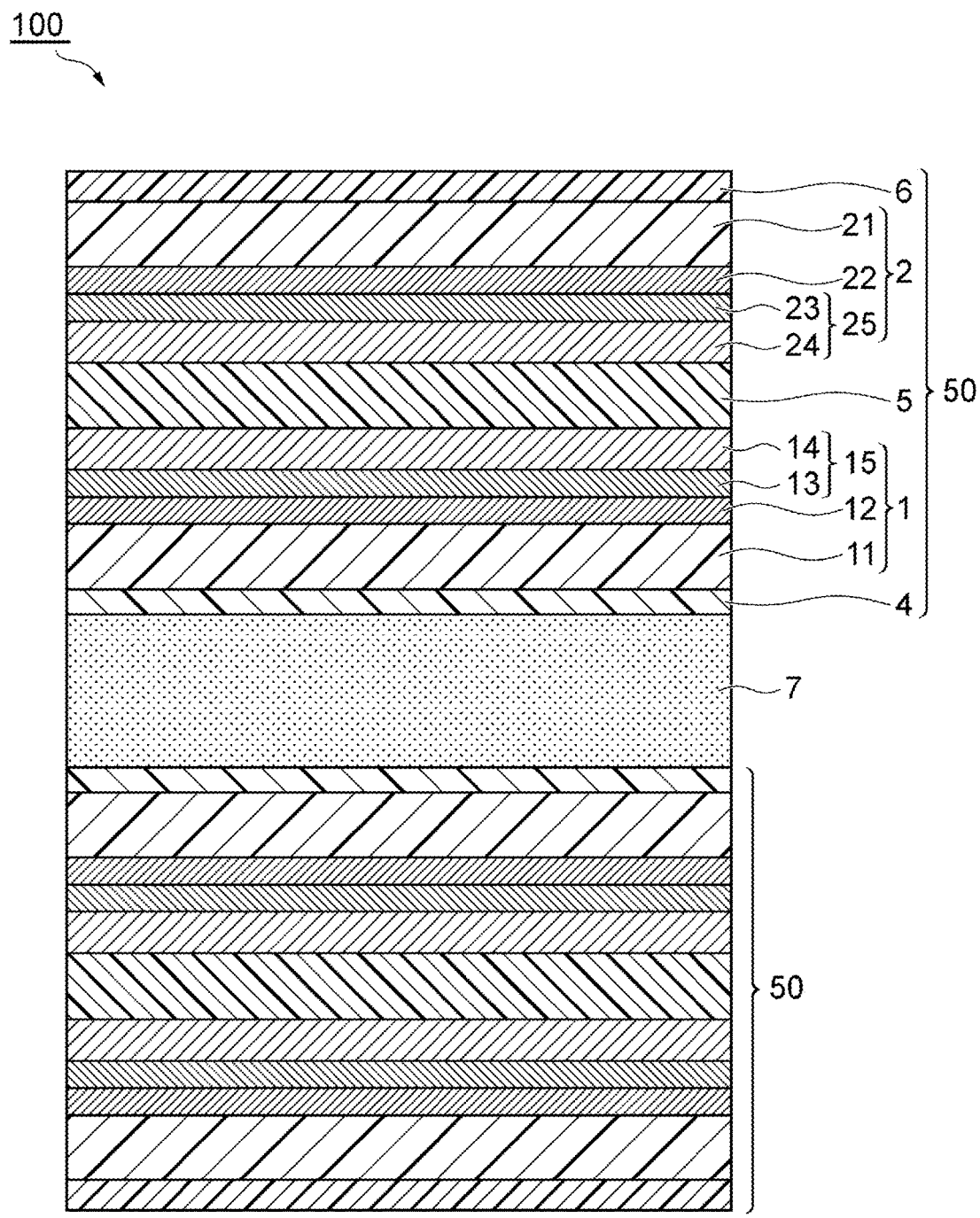
FIG. 1 is a schematic cross-sectional view showing an embodiment of the wavelength conversion sheet of the present invention.

With reference to the drawing, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawing is schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

An optical laminate according to the present invention comprises an adherend including a curable resin, and a barrier film laminated on at least one surface of the adherend, wherein the barrier film comprises, on an outermost surface facing the adherend, a primer layer formed by curing a primer composition containing a silane coupling agent having a reactive functional group capable of reacting with the curable resin, other than an alkoxysilane group and a silanol group, and assuming that a thickness of the primer layer is D, a total content of the reactive functional group and the reactive functional group that has reacted with the curable resin per 1 m2×D of the primer layer is 1.5×10-6 mol or higher and 3.5×10-3 mol or lower. A specific example of the optical laminate is a wavelength conversion sheet. Further, the adherend varies depending on the kind of the optical laminate, and is a phosphor layer when the optical laminate is a wavelength conversion sheet. In the following, preferred embodiments of the present invention will be described based on the case where the optical laminate is a wavelength conversion sheet.

[Wavelength Conversion Sheet]

FIGS. 1 to 6 are schematic cross-sectional views showing an embodiment of the wavelength conversion sheet of the present invention. The wavelength conversion sheet 100 shown in FIG. 1 has a structure in which a phosphor layer 7 having a wavelength conversion function and containing a curable resin and a phosphor is sandwiched between a pair of barrier films 50. Each barrier film 50 comprises a first film 1, a second film 2, a primer layer 4, an adhesive layer 5 and a mat layer 6. The first film 1 comprises a first substrate 11, an anchor coat layer 12, and a barrier layer 15 including an inorganic thin film layer 13 and a gas barrier coating layer 14. The second film 2 comprises a second substrate 21, an anchor coat layer 22, and a barrier layer 25 including an inorganic thin film layer 23 and a gas barrier coating layer 24. The first film 1 and the second film 2 are bonded via the adhesive layer 5 in such a manner that the gas barrier coating layer 14 and the gas barrier coating layer 24 face each other. In the barrier film 50, the primer layer 4 is disposed on the first substrate 11 side of the first film 1 and in contact with the first substrate 11. The mat layer 6 is disposed on the second substrate 21 side of the second film 2 and in contact with the second substrate 21. The pair of barrier films 50 and the phosphor layer 7 are laminated such that the primer layers 4 are in contact with the phosphor layer 7. The wavelength conversion sheet 100 having the structure shown in FIG. 1 is capable of more sufficiently suppressing transmittance of moisture and oxygen due to the barrier films 50 each comprising two laminated gas barrier films, that is, the first and second films 1 and 2. Further, in the barrier film 50, the barrier layers 15 and 25 are placed further inside than the first and second substrates 11 and 21 (between the first substrate 11 and the second substrate 21). Thus, the barrier layers 15 and 25 are protected, and damage to the barrier layers 15 and 25 before being laminated with the phosphor layer 7 is suppressed.

Figure 2:
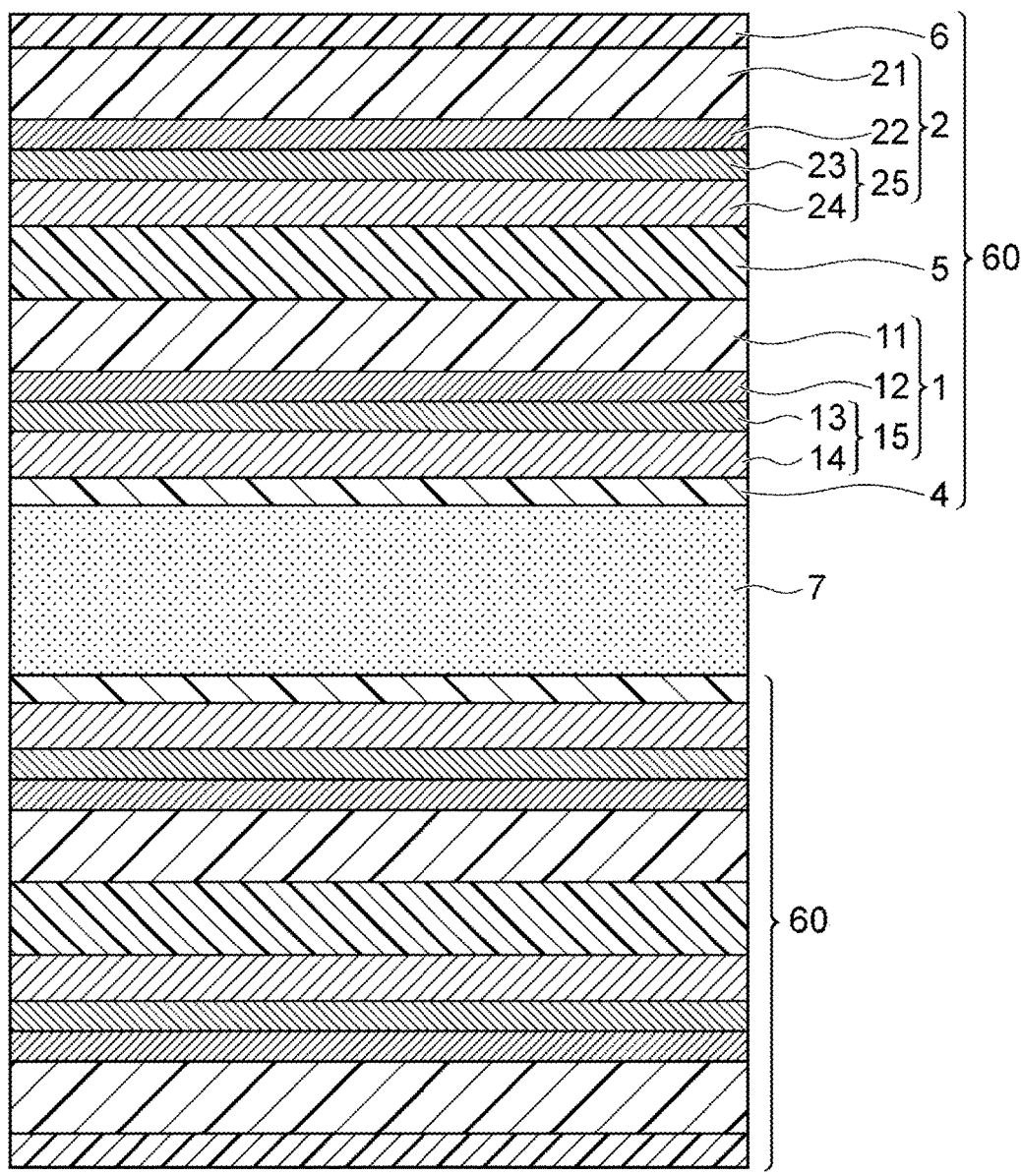
FIG. 2 is a schematic cross-sectional view showing an embodiment of the wavelength conversion sheet of the present invention.

The wavelength conversion sheet 200 shown in FIG. 2 has a structure in which a phosphor layer 7 having a wavelength conversion function and containing a curable resin and a phosphor is sandwiched between a pair of barrier films 60. Each barrier film 60 comprises a first film 1, a second film 2, a primer layer 4, an adhesive layer 5 and a mat layer 6. The first film 1 comprises a first substrate 11, an anchor coat layer 12, and a barrier layer 15 including an inorganic thin film layer 13 and a gas barrier coating layer 14. The second film 2 comprises a second substrate 21, an anchor coat layer 22, and a barrier layer 25 including an inorganic thin film layer 23 and a gas barrier coating layer 24. The first film 1 and the second film 2 are bonded via the adhesive layer 5 in such a manner that the first substrate 11 and the gas barrier coating layer 24 face each other. In the barrier film 60, the primer layer 4 is disposed on the gas barrier coating layer 14 side of the first film 1 and in contact with the gas barrier coating layer 14. The mat layer 6 is disposed on the second substrate 21 side of the second film 2 and in contact with the second substrate 21. The pair of barrier films 60 and the phosphor layer 7 are laminated such that the primer layers 4 are in contact with the phosphor layer 7. The wavelength conversion sheet 200 having the structure shown in FIG. 2 is capable of more sufficiently suppressing transmittance of moisture and oxygen due to the barrier films 60 each comprising two laminated gas barrier films, that is, the first and second films 1 and 2. Further, since the barrier layer 15 is placed on the primer layer 4 side in the barrier film 60, that is, at a position closer to the phosphor layer 7, it is possible to more sufficiently suppress penetration of moisture and oxygen to the phosphor layer 7.

Figure 3:
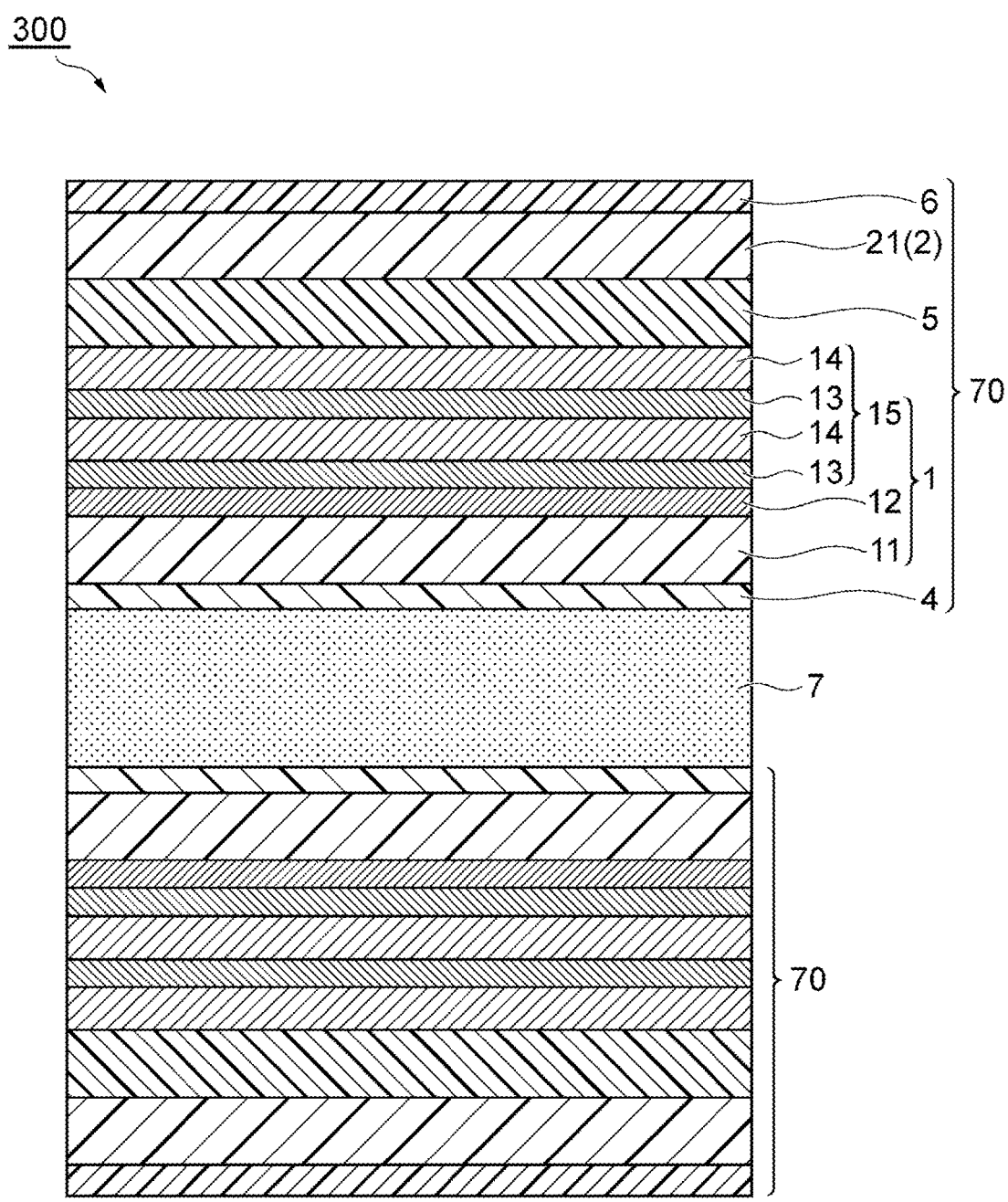
FIG. 3 is a schematic cross-sectional view showing an embodiment of the wavelength conversion sheet of the present invention.

The wavelength conversion sheet 300 shown in FIG. 3 has a structure in which a phosphor layer 7 having a wavelength conversion function and containing a curable resin and a phosphor is sandwiched between a pair of barrier films 70. Each barrier film 70 comprises a first film 1, a second film 2, a primer layer 4, an adhesive layer 5 and a mat layer 6. The first film 1 comprises a first substrate 11, an anchor coat layer 12, and a barrier layer 15 including two inorganic thin film layers 13 and two gas barrier coating layers 14 laminated alternately. The second film 2 is composed of only the second substrate 21. The first film 1 and the second film 2 are bonded via the adhesive layer 5 in such a manner that the gas barrier coating layer 14 and the second substrate 21 face each other. In the barrier film 70, the primer layer 4 is disposed on the first substrate 11 side of the first film 1 and in contact with the first substrate 11. The mat layer 6 is disposed on the surface of the second substrate 21 forming the second film 2 on the side facing away from the adhesive layer 5 and in contact with the second substrate 21. The pair of barrier films 70 and the phosphor layer 7 are laminated such that the primer layers 4 are in contact with the phosphor layer 7. Since the second film 2 of the wavelength conversion sheet 300 having the structure shown in FIG. 3 is composed only of the second substrate 21, the manufacturing process can be simplified and the cost can be reduced, and further, it is possible to impart rigidity to the barrier film 70 as required by changing the thickness of the second substrate 21. In addition, since the barrier layer 15 has a structure in which two inorganic thin film layers 13 and two gas barrier coating layers 14 are alternately laminated, the gas barrier properties can be enhanced.

Figure 4:
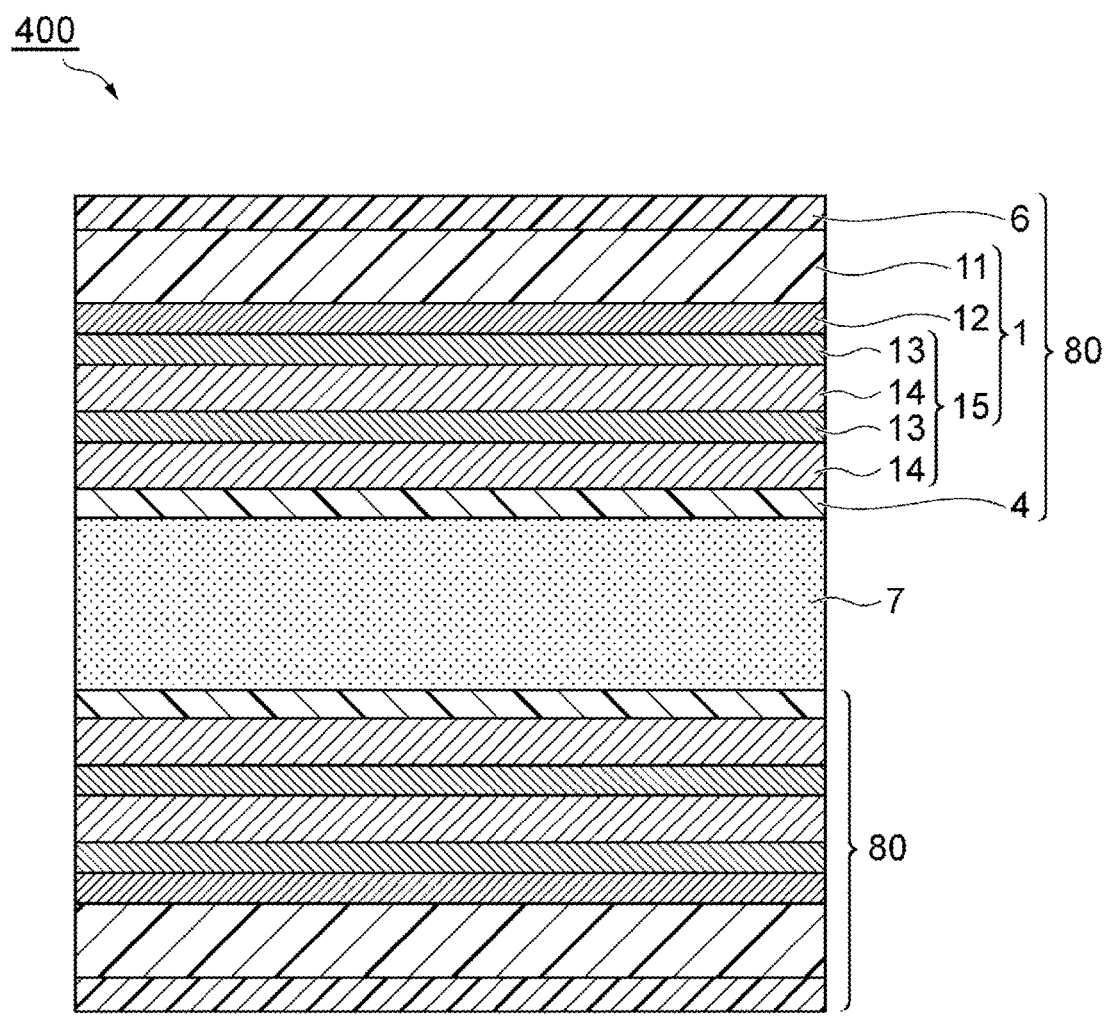
FIG. 4 is a schematic cross-sectional view showing an embodiment of the wavelength conversion sheet of the present invention.

The wavelength conversion sheet 400 shown in FIG. 4 has a structure in which a phosphor layer 7 having a wavelength conversion function and containing a curable resin and a phosphor is sandwiched between a pair of barrier films 80. Each barrier film 80 comprises a first film 1, a primer layer 4, and a mat layer 6. The first film 1 comprises a first substrate 11, an anchor coat layer 12, and a barrier layer 15 including two inorganic thin film layers 13 and two gas barrier coating layers 14 laminated alternately. In the barrier film 80, the primer layer 4 is disposed on the gas barrier coating layer 14 side of the first film 1 and in contact with the gas barrier coating layer 14. The mat layer 6 is disposed on the first substrate 11 side of the first film 1 and in contact with the first substrate 11. The pair of barrier films 80 and the phosphor layer 7 are laminated such that the primer layers 4 are in contact with the phosphor layer 7. Since the wavelength conversion sheet 400 having the structure shown in FIG. 4 does not include the second film 2 and the adhesive layer 5, the manufacturing process can be simplified, and the cost can be reduced, and the thickness can be reduced. In addition, since the barrier layer 15 has a structure in which two inorganic thin film layers 13 and two gas barrier coating layers 14 are alternately laminated, the gas barrier properties can be enhanced. Further, since the barrier layer 15 is placed on the primer layer 4 side in the barrier film 80, that is, at a position closer to the phosphor layer 7, it is possible to more sufficiently suppress penetration of moisture and oxygen to the phosphor layer 7.

Figure 5:
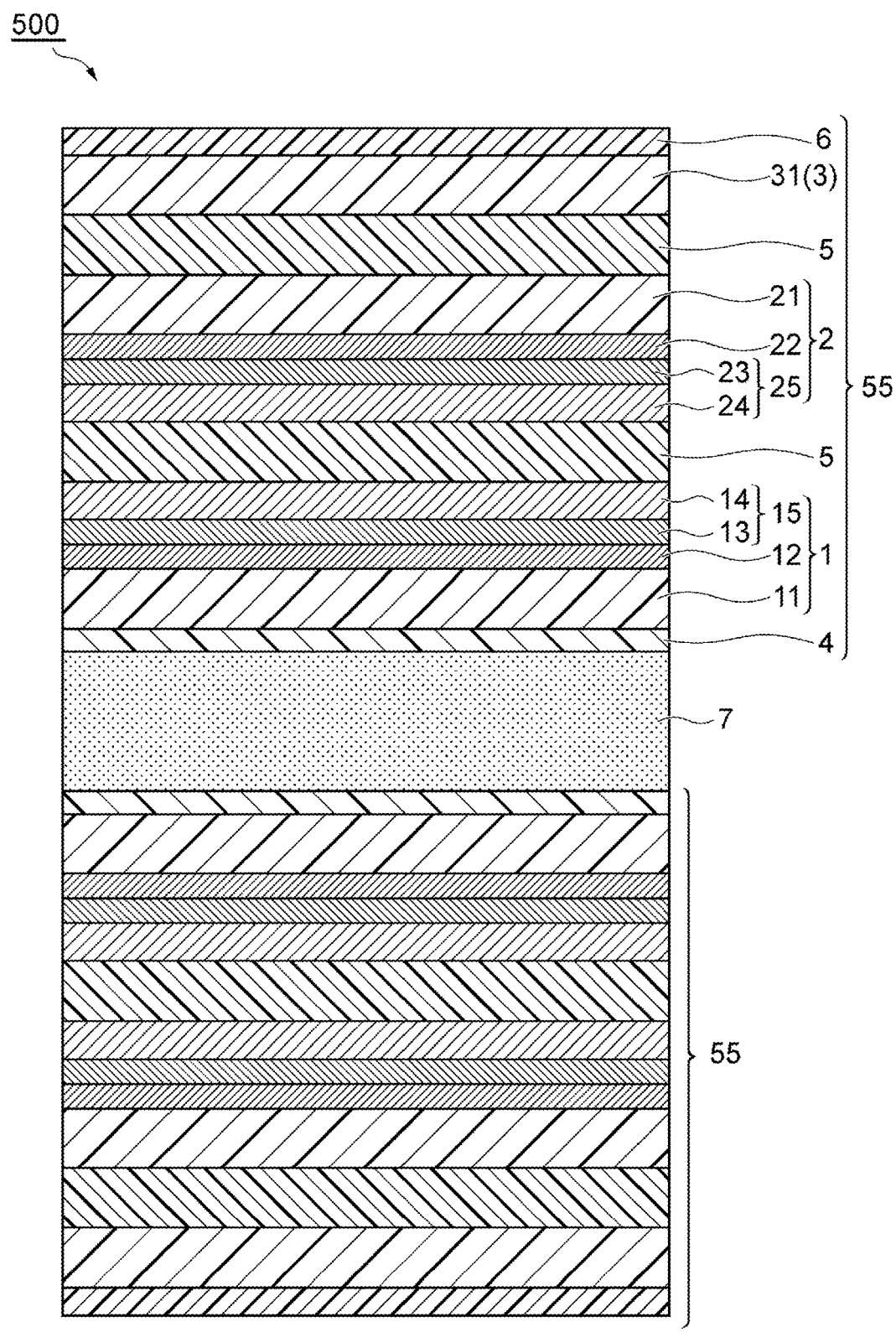
FIG. 5 is a schematic cross-sectional view showing an embodiment of the wavelength conversion sheet of the present invention.

The wavelength conversion sheet 500 shown in FIG. 5 has a structure in which a phosphor layer 7 having a wavelength conversion function and containing a curable resin and a phosphor is sandwiched between a pair of barrier films 55. Each barrier film 55 comprises a first film 1, a second film 2, a third film 3, a primer layer 4, an adhesive layer 5 and a mat layer 6. The first film 1 comprises a first substrate 11, an anchor coat layer 12, and a barrier layer 15 including an inorganic thin film layer 13 and a gas barrier coating layer 14. The second film 2 comprises a second substrate 21, an anchor coat layer 22, and a barrier layer 25 including an inorganic thin film layer 23 and a gas barrier coating layer 24. The third film 3 is composed of only a third substrate 31. The first film 1 and the second film 2 are bonded via the adhesive layer 5 in such a manner that the gas barrier coating layer 14 and the gas barrier coating layer 24 face each other. The second film 2 and the third film 3 are bonded via the adhesive layer 5 in such a manner that the second substrate 21 and the third substrate 31 face each other. In the barrier film 55, the primer layer 4 is disposed on the first substrate 11 side of the first film 1 and in contact with the first substrate 11. The mat layer 6 is disposed on the surface of the third substrate 31 forming the third film 3 on the side facing away from the adhesive layer 5 and in contact with the third substrate 31. The pair of barrier films 55 and the phosphor layer 7 are laminated such that the primer layers 4 are in contact with the phosphor layer 7. The wavelength conversion sheet 500 having the structure shown in FIG. 5 is capable of more sufficiently suppressing transmittance of moisture and oxygen due to the barrier films 55 each comprising two laminated gas barrier films, that is, the first and second films 1 and 2. Further, in the barrier film 55, the barrier layers 15 and 25 are placed further inside than the first and second substrates 11 and 21 (between the first substrate 11 and the second substrate 21). Thus, the barrier layers 15 and 25 are protected, and damage to the barrier layers 15 and 25 before being laminated with the phosphor layer 7 is suppressed. Furthermore, since the barrier film 55 comprises the third film 3, generation of wrinkles in the barrier film 55 can be suppressed. In addition, rigidity can be imparted to the barrier film 55 as needed by changing the thickness of the third substrate 31.

Figure 6:
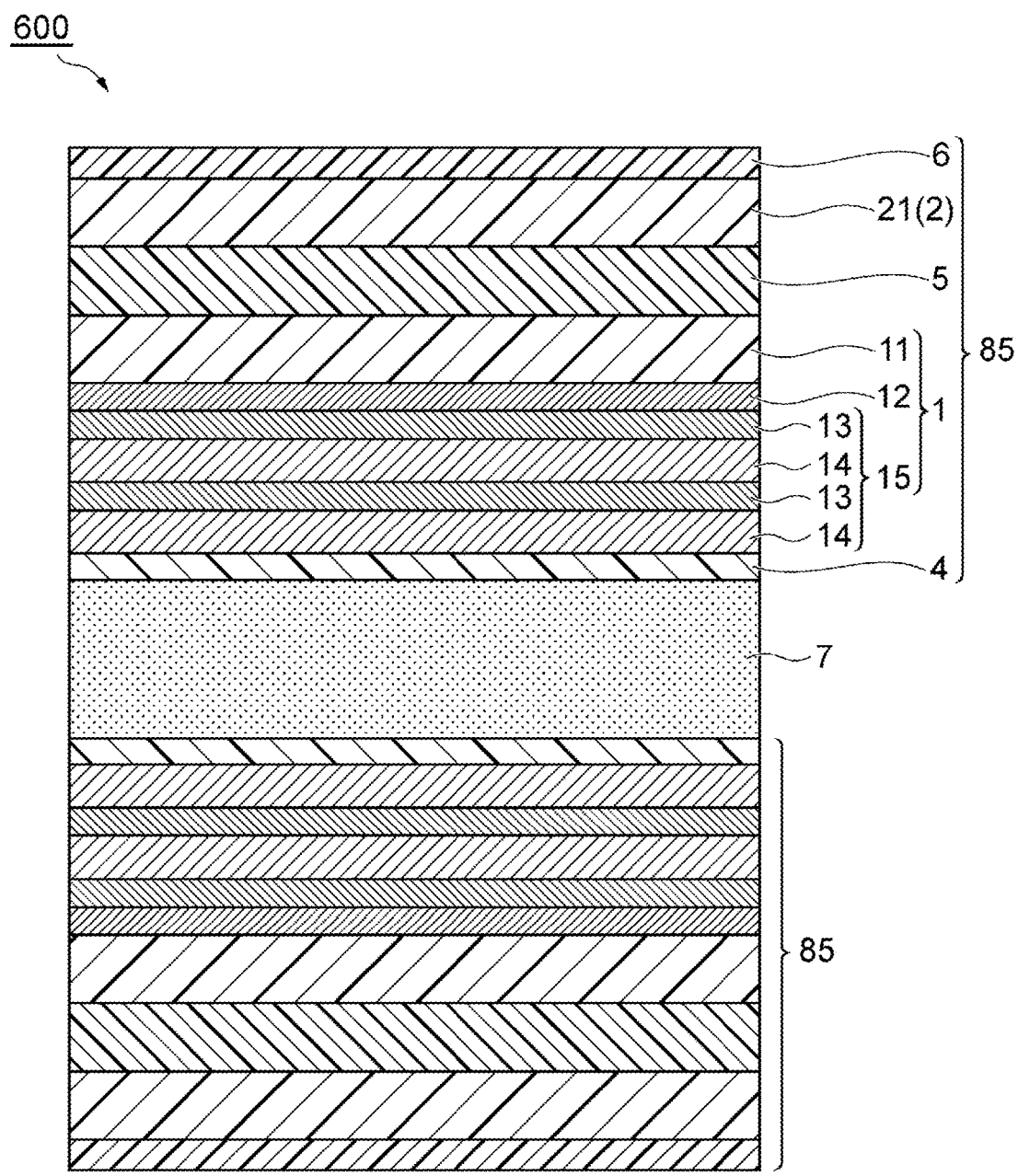
FIG. 6 is a schematic cross-sectional view showing an embodiment of the wavelength conversion sheet of the present invention.

The wavelength conversion sheet 600 shown in FIG. 6 has a structure in which a phosphor layer 7 having a wavelength conversion function and containing a curable resin and a phosphor is sandwiched between a pair of barrier films 85. Each barrier film 85 comprises a first film 1, a second film 2, a primer layer 4, an adhesive layer 5 and a mat layer 6. The first film 1 comprises a first substrate 11, an anchor coat layer 12, and a barrier layer 15 including two inorganic thin film layers 13 and two gas barrier coating layers 14 laminated alternately. The second film 2 is composed of only the second substrate 21. The first film 1 and the second film 2 are bonded via the adhesive layer 5 in such a manner that the first substrate 11 and the second substrate 21 face each other. In the barrier film 85, the primer layer 4 is disposed on the gas barrier coating layer 14 side of the first film 1 and in contact with the gas barrier coating layer 14. The mat layer 6 is disposed on the surface of the second substrate 21 forming the second film 2 on the side facing away from the adhesive layer 5 and in contact with the second substrate 21. The pair of barrier films 85 and the phosphor layer 7 are laminated such that the primer layers 4 are in contact with the phosphor layer 7. Since the second film 2 of the wavelength conversion sheet 600 having the structure shown in FIG. 6 is composed only of the second substrate 21, the manufacturing process can be simplified and the cost can be reduced, and further, it is possible to impart rigidity to the barrier film 85 as required by changing the thickness of the second substrate 21. In addition, since the barrier layer 15 has a structure in which two inorganic thin film layers 13 and two gas barrier coating layers 14 are alternately laminated, the gas barrier properties can be enhanced. Further, since the barrier layer 15 is placed on the primer layer 4 side in the barrier film 85, that is, at a position closer to the phosphor layer 7, it is possible to more sufficiently suppress penetration of moisture and oxygen to the phosphor layer 7.

The wavelength conversion sheet having the above-described configuration has good gas barrier properties and good adhesion between the primer layer 4 and the phosphor layer 7. Thus, it is possible to prevent the phosphor layer 7 and the barrier film from peeling off from each other. In addition, since the primer layer 4 exhibits very good adhesion to both of the first substrate 11 and the gas barrier coating layer 14, it is also possible to sufficiently prevent peeling within the barrier film. Therefore, the wavelength conversion sheet having the above-described configuration can maintain good gas barrier properties over a long period of time. It is more preferable to apply (coat) the primer layer 4 over the first substrate 11 in terms of adhesion. When the adhesion between the primer layer 4 and the first substrate 11 or the gas barrier coating layer 14 is poor, at least the surface of the first substrate 11 or the gas barrier coating layer 14 that is in contact with the primer layer 4 may be subjected to corona treatment, flame treatment, plasma treatment, or the like to enhance its adhesion to the primer layer 4.

Next, the layers constituting the wavelength conversion sheet will be described in detail.

(Substrates)

The first, second, and third substrates 11, 21 and 31 are preferably polymer films. Non-limiting examples of the materials of the polymer film include polyesters such as polyethylene terephthalate, polybutylene terephthalate, and polyethylene naphthalate; polyamides such as nylon; polyolefins such as polypropylene and cycloolefin; polycarbonate; and triacetyl cellulose. The polymer film is preferably a polyester film, a polyamide film, or a polyolefin film, more preferably a polyester film or a polyamide film, and even more preferably a polyethylene terephthalate film. A polyethylene terephthalate film is desirable from the viewpoint of transparency, processability, and adhesion. Further, the polyethylene terephthalate film is preferably a biaxially oriented polyethylene terephthalate film from the viewpoint of transparency and gas barrier properties.

The polymer film may optionally contain additives such as an antistatic agent, an ultraviolet absorber, a plasticizer, and a slip agent. The surface of the polymer film may be subjected to corona treatment, flame treatment, and plasma treatment.

In the wavelength conversion sheet, when the first substrate 11 and the primer layer 4 are in contact with each other, the first substrate 11 preferably has a polar functional group such as a hydroxyl group or a carbonyl group on its surface. Since the first substrate 11 has a polar functional group such as a hydroxyl group or a carbonyl group on its surface, the polar functional group such as a hydroxyl group reacts with a silanol group generated by hydrolysis of the alkoxysilane of a silane coupling agent in the primer layer 4, whereby the adhesion is enhanced. Among the above-mentioned polymer films, those that normally have a polar functional group such as a hydroxyl group or a carbonyl group on the surface include polyethylene terephthalate film, polybutylene terephthalate film, polyethylene naphthalate film, polyamide film, triacetyl cellulose film, acrylic film, and polycarbonate films. In the case where the first substrate 11 does not have a polar functional group such as a hydroxyl group or a carbonyl group on its surface, its adhesion with the primer layer 4 can be improved by performing surface treatment such as corona treatment, flame treatment, and plasma treatment.

The thickness of the first, second, and third substrates 11, 21, and 31 is not limited, but it is preferably between 3 μm and 100 μm inclusive, and more preferably between 5 μm and 50 μm inclusive from the viewpoint of processability and productivity. When this thickness is equal to or greater than 3 μm, processing is easy, and when it is equal to or smaller than 100 μm, the productivity of the barrier film per lot can be raised.

(Anchor Coat Layer)

The anchor coat layers 12 and 22 are provided between the first and second substrates 11 and 21 and the inorganic thin film layers 13 and 23, respectively, in order to improve the adhesion between them. The anchor coat layers 12 and 22 may have barrier properties to prevent the permeation of moisture and oxygen.

The anchor coat layers 12 and 22 may be formed using a resin selected from, for example, polyester resin, isocyanate resin, urethane resin, acrylic resin, polyvinyl alcohol resin, ethylene vinyl alcohol resin, vinyl modified resin, epoxy resin, oxazoline group containing resin, modified styrene resin, modified silicone resin, or alkyl titanate. The anchor coat layers can be formed using a single one of the above-described resins, or using a composite resin combining two or more of the above-described resins.

The anchor coat layers 12 and 22 can be formed by applying a solution containing the above-described resin(s) onto the first and second substrates 11 and 21, and then curing it by drying. The method of applying the solution may be a coating method performed with, for example, a gravure coater, a dip coater, a reverse coater, a wire bar coater, a die coater, or the like.

The thickness of the anchor coat layers 12 and 22 is preferably in the range of 5 to 500 nm, and more preferably in the range of 10 to 100 nm. When the thickness is 5 nm or greater, the adhesion between the first and second substrates 11 and 21 and the inorganic thin film layers 13 and 23, as well as the barrier properties against moisture and oxygen tend to be improved. When the thickness is 500 nm or smaller, a uniform layer with internal stress that is sufficiently suppressed tends to be formed.

(Barrier Layer)

The barrier layers 15 and 25 are layers provided to further improve the water vapor permeability and the oxygen permeability. Considering the optical properties, it is desirable that the barrier layers 15 and 25 have high transparency. The barrier layers 15 and 25 may have a single layer or multi-layer structure, but as shown in FIGS. 1 to 6, preferably they comprise the inorganic thin film layers 13 and 23 and the gas barrier coating layers 14 and 24. Further, when the gas barrier coating layer 14 and the primer layer 4 are in contact with each other as shown in FIGS. 2 and 4, it is desirable that the gas barrier coating layer 14 has a siloxane bond. When the gas barrier coating layer 14 has a siloxane bond, the adhesion between the gas barrier coating layer 14 and the primer layer 4 can be further improved.

The barrier layers 15 and 25 may be formed in air or in vacuum. Examples of the vacuum deposition method include physical vapor deposition and chemical vapor deposition. Examples of physical vapor deposition include vacuum evaporation, sputtering, and ion plating. Examples of chemical vapor deposition (CVD) include thermal CVD, plasma-enhanced CVD (PECVD), and photo CVD. The inorganic thin film layers 13 and 23 and the gas barrier covering layers 14 and 24 may be formed by different film formation methods.

(Inorganic Thin Film Layer)

The formation method of the inorganic thin film layers 13 and 23 is preferably vacuum evaporation, sputtering, or PECVD. In the case of vacuum evaporation, the formation method is more preferably resistance heating vacuum deposition, electron beam heating vacuum deposition, or induction heating vacuum deposition, and in the case of sputtering, it is more preferably reactive sputtering or dual magnetron sputtering. Sputtering is preferred from the viewpoint of film homogeneity, and vacuum evaporation is preferred from the viewpoint of cost. The specific method can be selected according to the purpose and application.

Examples of the plasma generation method for sputtering and PECVD include the DC (Direct Current) method, RF (Radio Frequency) method, MF (Middle Frequency) method, DC pulse method, RF pulse method, and DC+RF superposition method.

In the case of vacuum deposition, typically, a film of metal or silicon, or a film of an oxide of metal, silicon, or the like, or nitride or oxynitride (i.e., metal film, metal oxide film, metal nitride film, metal oxynitride film, silicon film, silicon oxide film, silicon nitride film, silicon oxynitride film, or the like) is formed. The inorganic thin film layers 13 and 23 are preferably formed of a film of metal such as aluminum, titanium, copper, indium, and tin, or a film of oxide thereof (for example, alumina), or a film of silicon or silicon oxide. The material of the film is not limited to metal and silicon oxides, and it may be metal nitride or oxynitride, or silicon nitride or oxynitride. Further, a film containing a plurality of metals may be formed. The aforementioned films of aluminum, titanium, copper, and indium, and oxide, nitride, and oxynitride of silicon have good transparency and barrier properties. A film of oxide or oxynitride containing silicon has high barrier properties and thus it is particularly preferable.

The thickness of the inorganic thin film layers 13 and 23 formed by vacuum deposition is preferably 5 nm or greater and 100 nm or smaller. When the thickness of the inorganic thin film layers 13 and 23 is 5 nm or greater, better barrier properties tend to be obtained. In addition, when the thickness of the inorganic thin film layers 13 and 23 is 100 nm or smaller, generation of cracks tends to be suppressed, and thus deterioration in the water vapor barrier properties and the oxygen barrier properties due to cracks can be suppressed. Further, when the thickness of the inorganic thin film layers 13 and 23 is 100 nm or smaller, factors such as reduced amount of material used and shorter film formation time lead to a reduced cost, which is preferable from an economic viewpoint.

(Gas Barrier Coating Layer)

The gas barrier coating layers 14 and 24 are provided to prevent various kinds of secondary damage in the subsequent steps and to provide high barrier properties.

The gas barrier coating layers 14 and 24 may contain a siloxane bond. The gas barrier coating layers 14 and 24 can also be formed in air. In the case where the gas barrier coating layers 14 and 24 are formed in air, for example, a coating solution containing a compound having polarity such as polyvinyl alcohol, polyvinyl pyrrolidone, and ethylene vinyl alcohol; a compound containing chlorine such as polyvinylidene chloride; a compound containing a Si atom; a compound containing a Ti atom; a compound containing an Al atom; a compound containing a Zr atom; and the like can be applied onto the inorganic thin film layers 13 and 23 and dried for curing to thereby form them.

The coating method of the coating solution for forming the gas barrier coating layers 14 and 24 in air may specifically be a coating method using a gravure coater, a dip coater, a reverse coater, a wire bar coater, a die coater, etc.

A compound containing a siloxane bond is preferably formed, for example, by using a silane compound and reacting the silanol group. An example of such silane compound is a compound represented by the following formula (1).

$$R^1_n(OR^2)_{4-n}Si \quad (1)$$

[wherein n represents an integer from 0 to 3, and $R^1$ and $R^2$ each independently represent a hydrocarbon group, preferably an alkyl group having 1 to 4 carbon atoms.]

Examples of the compound represented by the formula (1) include tetramethoxysilane, tetraethoxysilane, tetrapropoxysilane, tetrabutoxysilane, methyltrimethoxysilane, methyltriethoxysilane, dimethyldimethoxysilane, and dimethyldiethoxysilane. A polysilazane containing nitrogen may also be used.

The material of the gas barrier coating layers 14 and 24 may be a material made from a precursor formed of another metal atom. An example of the compounds containing a Ti atom is a compound represented by the following formula (2).

$$R^1_n(OR^2)_{4-n}Ti \quad (2)$$

[wherein n represents an integer from 0 to 3, and $R^1$ and $R^2$ each independently represent a hydrocarbon group, preferably an alkyl group having 1 to 4 carbon atoms.]

Examples of the compound represented by the above formula (2) include tetramethoxytitanium, tetraethoxytitanium, tetraisopropoxytitanium, and tetrabutoxytitanium.

An example of the compounds containing an Al atom is a compound represented by the following formula (3).

$$R^1_m(OR^2)_{3-m}Al \quad (3)$$

[wherein m represents an integer from 0 to 2, and $R^1$ and $R^2$ each independently represent a hydrocarbon group, preferably an alkyl group having 1 to 4 carbon atoms.]

Examples of the compound represented by the above formula (3) include trimethoxyaluminum, triethoxyaluminum, aluminum triisopropoxide, and tributoxyaluminum.

An example of the compounds containing a Zr atom is a compound represented by the following formula (4).

$$R^1_n(OR^2)_{4-n}Zr \quad (4)$$

[wherein n represents an integer from 0 to 3, and $R^1$ and $R^2$ each independently represent a hydrocarbon group, preferably an alkyl group having 1 to 4 carbon atoms.]

Examples of the compound represented by the above formula (4) include tetramethoxyzirconium, tetraethoxyzirconium, tetraisopropoxyzirconium, and tetrabutoxyzirconium.

When the gas barrier coating layers 14 and 24 are formed in air, the coating solution is cured after being applied. The curing method is not limited but examples thereof include ultraviolet curing and thermal curing. In the case of UV curing, the coating solution may contain a polymerization initiator and a compound having a double bond. Further, heat aging may be performed as needed.

As another method of forming the gas barrier coating layers 14 and 24 in air, particles of inorganic oxides of magnesium, calcium, zinc, aluminum, silicon, titanium, zirconium, etc., may be reacted with one another to cause dehydration condensation via phosphorus atoms derived from a phosphorus compound, and the obtained reaction product may be used for the gas barrier coating layers. Specifically, a functional group (for example, a hydroxyl group) present on the surface of an inorganic oxide and a site (for example, a halogen atom directly bonded to a phosphorus atom or an oxygen atom directly bonded to a phosphorus atom) of a phosphorus compound capable of reacting with such an inorganic oxide may react with each other by condensation and bond with each other. The reaction product is obtained, for example, by applying a coating solution containing an inorganic oxide and a phosphorus compound onto the surface of the inorganic thin film layers 13 and 23 and thermally treating the formed coating film so that the particles of the inorganic oxide react and bond with one another via phosphorus atoms derived from the phosphorus compound. The lower limit of the temperature for the heat treatment is 110° C. or higher, preferably 120° C. or higher, more preferably 140° C. or higher, and still more preferably 170° C. or higher. When the heat treatment temperature is low, it is difficult to obtain a sufficient reaction rate and this results in decreased productivity. Although the preferable upper limit of the temperature of heat treatment varies depending on factors such as the kind of the substrate, it is 220° C. or lower, and preferably 190° C. or lower. The heat treatment can be performed in air, nitrogen atmosphere, argon atmosphere, or the like.

In the case where the gas barrier coating layers 14 and 24 are formed in air, the coating liquid may further contain a resin unless aggregation or the like occurs. Specifically, examples of the resin include acrylic resin and polyester resin. The coating liquid preferably contains resin with high compatibility with the other materials in the coating liquid.

The coating liquid may further contain a filler, a leveling agent, an antifoaming agent, an ultraviolet light absorber, an antioxidant, a silane coupling agent, a titanium chelating agent, and the like as required.

The thickness of the gas barrier coating layers 14 and 24 formed in air is preferably 50 nm to 2000 nm, and more preferably 100 nm to 1000 nm (after curing). When the thickness of the gas barrier coating layers 14 and 24 formed in air is 50 nm or greater, the film formation tends to be facilitated. When the thickness of the gas barrier coating layers 14 and 24 formed in air is 2000 nm or smaller, cracking or curling tends to be suppressed.

(Adhesive Layer)

The adhesive layer 5 is, as shown in FIGS. 1 to 3 and 5 to 6, provided between the first film 1 and the second film 2 in order to bond the first film 1 and the second film 2 together and laminate them. When there is a third barrier film as shown in FIG. 5, the adhesive layer is also provided between the second film 2 and the third film 3 to bond the second film 2 and the third film 3 together and laminate them. The adhesive layer 5 may be formed of a common adhesive or pressure-sensitive adhesive for polymer films, and is selected as appropriate according to the surfaces of the first film 1 and the second film 2 to be bonded together. Candidates for the material of the adhesive layer 5 include epoxy, polyester, acrylic, rubber, phenol, and urethane adhesives or pressure-sensitive adhesives.

The method of applying the adhesive or pressure-sensitive adhesive may be a coating method performed with, for example, a gravure coater, a dip coater, a reverse coater, a wire bar coater, a die coater, or the like.

The thickness of the adhesive 5 is preferably 1 µm or greater and 20 µm or smaller. When the thickness of the adhesive layer 5 is 1 µm or greater, sufficient adhesiveness tends to be obtained, and when it is 20 µm or smaller, the total thickness of the barrier film tends to be reduced and also the cost tends to be reduced.

Further, aging may be performed after bonding the first film 1 and the second film 2 or the second film 2 and the third film 3 via the adhesive layer 5. Aging is performed, for example, at 20 to 80° C. for 1 to 10 days.

The adhesive layer 5 may contain a curing agent, an antistatic agent, a silane coupling agent, an ultraviolet absorber, an antioxidant, a leveling agent, a dispersing agent, or the like, as necessary.

(Primer Layer)

The primer layer 4 is a layer provided to improve the adhesion between the barrier film and the phosphor layer 7 to suppress peeling between the barrier film and the phosphor layer 7. The primer layer 4 is provided on the first substrate 11 of the first film 1 or on the gas barrier coating layer 14.

The primer layer 4 is a layer formed of a cured primer composition containing a silane coupling agent having reactive functional groups capable of reacting with the curable resin contained in the phosphor layer 7, other than alkoxysilane and silanol groups. In the primer layer 4, assuming that the thickness of the primer layer 4 is D, the total content (per 1 m$^2$×D of the primer layer 4) of the reactive functional group and the reactive functional group that has reacted with the curable resin is $1.5 \times 10^{-6}$ mol or higher and $3.5 \times 10^{-3}$ mol or lower.

Examples of the reactive functional group capable of reacting with the curable resin contained in the phosphor layer 7 excluding alkoxysilane and silanol groups include a vinyl group, epoxy group, styryl group, methacrylic group, acrylic group, amino group, isocyanurate group, ureido group, mercapto group, sulfide group, and isocyanate group, and the one capable of reacting with the curable resin contained in the phosphor layer 7 is selected from these groups. Among the listed reactive functional groups, from the viewpoint of obtaining better adhesion between the barrier film and the phosphor layer 7, it is preferably to select one capable of reacting with the curable resin from the group consisting of a vinyl group, epoxy group, acrylic group, methacrylic group, amino group, and mercapto group. The silane coupling agent may have one or more kinds of reactive functional groups.

Examples of a silane coupling agent having a vinyl group include vinyltrimethoxysilane, vinyltriethoxysilane, vinyltris(2-methoxyethoxy)silane, vinylmethyldimethoxysilane, and 3-acryloxypropyl. Among these, vinyltrimethoxysilane and vinylmethyldimethoxysilane are preferable from the viewpoint of reactivity. These can be used singly or in combination of two or more.

Examples of a silane coupling agent having an epoxy group include 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane. Among these, 3-glycidoxypropylmethyldimethoxysilane and 3-glycidoxypropyltrimethoxysilane are preferable from the viewpoint of reactivity. These can be used singly or in combination of two or more.

Examples of a silane coupling agent having a styryl group include p-styryltrimethoxysilane.

Examples of a silane coupling agent having a methacrylic group include 3-methacryloxypropylmethyldimethoxysilane, 3-methacryloxypropyltrimethoxysilane, 3-methacryloxypropylmethyldiethoxysilane, and 3-methacryloxypropyltriethoxysilane. Among these, 3-methacryloxypropylmethyldimethoxysilane and 3-methacryloxypropyltrimethoxysilane are preferable from the viewpoint of reactivity. These can be used singly or in combination of two or more.

Examples of a silane coupling agent having an acrylic group include 3-acryloxypropyltrimethoxysilane.

Examples of a silane coupling agent having an amino group include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and a hydrochloride of N-(vinylbenzyl)-2-aminoethyl-3-aminopropyltrimethoxysilane. Among these, 3-aminopropyltriethoxysilane is preferable from the viewpoint of reactivity. These can be used singly or in combination of two or more.

Examples of a silane coupling agent having an isocyanurate group include tris-(trimethoxysilylpropyl)isocyanurate.

Examples of a silane coupling agent having an ureido group include 3-ureidopropyltriethoxysilane.

Examples of a silane coupling agent having a mercapto group include 3-mercaptopropylmethyldimethoxysilane and 3-mercaptopropyltrimethoxysilane. Among these, 3-mercaptopropyltrimethoxysilane is preferable from the viewpoint of reactivity. Another example of a silane coupling agent having a mercapto group is a silane coupling agent in which the mercapto group is protected by an alkoxysilyl group or the like from the viewpoint of odor. These can be used singly or in combination of two or more.

Examples of a silane coupling agent having a sulfide group include bis(triethoxysilylpropyl)tetrasulfide, and 3-octanoylthio-1-propyltriethoxysilane. Among these, bis(triethoxysilylpropyl)tetrasulfide is preferable from the viewpoint of reactivity. These can be used singly or in combination of two or more.

Examples of a silane coupling agent having an isocyanate group include 3-isocyanatopropyltriethoxysilane and 3-isocyanatopropyltrimethoxysilane. Among these, 3-isocyanatopropyltrimethoxysilane is preferable from the viewpoint of reactivity. These can be used singly or in combination of two or more.

From the viewpoint of obtaining better adhesion between the barrier film and the phosphor layer 7, the combination of the curable resin and the reactive functional group is preferably one of the following combinations (a) to (c).

(a) The curable resin comprises an acrylic resin, and the reactive functional group comprises at least one selected from the group consisting of a vinyl group, an acrylic group, a methacrylic group, and a mercapto group.

(b) The curable resin comprises an epoxy resin, and the reactive functional group comprises at least one selected from the group consisting of an epoxy group, an amino group, and a mercapto group.

(c) The curable resin comprises a thiol resin, and the reactive functional group comprises at least one selected from the group consisting of an epoxy group, a mercapto group, a vinyl group, and a methacrylic group.

The primer composition forming the primer layer 4 preferably further contains an organic metal compound. The organic metal compound preferably includes at least one selected from the group consisting of metal chelate compounds, metal alkoxide compounds, and metal acylate compounds. Among these, metal chelate compounds and metal alkoxide compounds are preferable in terms of promoting the reactivity of hydrolysis. Further, the organic metal compound preferably contains at least one metal selected from the group consisting of aluminum, zirconium, titanium, and tin. Among these, the organic metal compound preferably includes at least one metal selected from the group consisting of aluminum, zirconium, and titanium from the environmental aspect. Further, in order to improve the initial adhesion between the barrier film and the phosphor layer 7, preferably it includes at least one metal selected from the group consisting of zirconium and titanium, and in order to improve the adhesion after aging, preferably it includes at least one metal selected from the group consisting of zirconium and aluminum. In order to have good adhesion both in the initial phase and after aging, it is particularly preferable to include zirconium.

Examples of the metal chelate compounds include zirconiumethylacetoacetate, zirconium tributoxymonoacetylacetonate, zirconiumtetraacetylacetonate, zirconiumdibutoxybi s(ethylacetoacetate), zirconiummonoacetylacetonate, titaniumdiisopropoxybi s(acetylacetonate), titaniumtetraacetylacetonate, titaniumdiisopropoxybi s(ethylacetoacetate), titaniumdi-2-ethylhexoxybis(2-ethyl-3-hydroxyhexoxide), titaniumdii sopropoxybis(triethanolaminate), titanium-1,3-propanedioxybis(ethylacetoacetate), titaniumaminoethylaminoethanolate, titaniumacetylacetonate, titaniumethylacetoacetate, titanium phosphate compounds, titaniumoctyleneglycolate, titaniumethylacetoacetate, aluminumtrisethylacetoacetate, aluminumtrisacetylacetonate, and aluminumbisethylacetoacetatemonoacetylacetonate. Among these, from the viewpoint of solubility in organic solvents, zirconium tributoxymonoacetylacetonate, zirconiumtetraacetylacetonate, zirconiumdibutoxybis(ethylacetoacetate), titaniumdiisopropoxybis(ethylacetoacetate), titaniumdi-2-ethylhexoxybis(2-ethyl-3-hydroxyhexoxide), titaniumdiisopropoxybis(triethanolaminate), titanium-1,3-propanedioxybis(ethylacetoacetate), titaniumaminoethylaminoethanolate, titaniumdiisopropoxybis(acetylacetonate), titaniumtetraacetylacetonate, and aluminumbisethylacetoacetatemonoacetylacetonate are preferred. These can be used singly or in combination of two or more.

Examples of the metal alkoxide compounds include zirconium tetra-n-propoxide, n-propylzirconate, n-butylzirconate, titaniumtetra-n-butoxide, titanium butoxide dimer, titaniumtetra-2-ethylhexoxide, titanium tetraisopropoxide, tert-amyltitanate, tetra-tert-butyltitanate, tetra-isopropyl titanate, tetra-n-butyl titanate, butyltitanatedimer, tetra-octyltitanate, tetra-i sopropyltitanate, tetra-stearyltitanate, aluminum isopropoxide, and aluminum sec-butoxide. Among these, from the viewpoint of solubility in organic solvents, zirconiumtetra-n-propoxide, titanium tetra-n-butoxide, titanium butoxide dimer, titaniumtetra-2-ethylhexoxide, titanium tetraisopropoxide, tert-amyltitanate, tetra-tert-butyltitanate, and aluminum sec-butoxide are preferred. These can be used singly or in combination of two or more.

Examples of the metal acylate compounds include zirconium octylate compounds, zirconium stearate, and titanium isostearate. These can be used singly or in combination of two or more.

Among the organic metal compounds listed above, it is preferable to use metal chelate compounds from the viewpoint of controlling the pot life after preparation of the mixture.

The carbon number of the organic metal compound is preferably 2 to 120, and more preferably 6 to 72. When the carbon number is in the above range, the pot life after preparation of the mixture can be controlled more easily.

When the primer composition contains an organic metal compound, the ratio (mass ratio) of the silane coupling agent having a reactive functional group and the organic metal compound is preferably 100:1 to 1:100, and more preferably 10:1 to 1:10. When the ratio of the organic metal compound to the silane coupling agent is 100:1 or greater, the time required for the film formation of the primer layer 4 tends to be shortened, and also the tackiness of the primer layer 4 tends to be suppressed. When it is 1:100 or smaller, the adhesion between the barrier film and the phosphor layer 7 tends to be improved.

The primer composition forming the primer layer 4 may contain components other than the silane coupling agent having the reactive functional group mentioned above, and the organic metal compound. Examples of other components include a dilution solvent, a slip agent, an antifoam agent, and an antistatic agent.

Examples of the dilution solvent include toluene, methyl ethyl ketone, ethyl acetate, butyl acetate, hexane, 1-butanol, isopropyl alcohol, and water. These can be used singly or in combination of two or more. Although the content of the dilution solvent is not limited, typically, it is 0 to 99.9% by mass, preferably 70 to 98% by mass, relative to the total amount of the primer composition. When the amount of the dilution solvent is insufficient, the reactivity increases and may cause the coating solution to become gelled, and when the amount of the dilution solvent is too large, the price of the coating solution increases.

The primer layer 4 can be formed by applying the above-described primer composition onto the first substrate 11 or the gas barrier coating layer 14 of the first film 1 and curing it. The method of applying the solution may be a coating method performed with, for example, a gravure coater, a dip coater, a reverse coater, a wire bar coater, a die coater, or the like. Curing can be performed, for example, under the conditions of 80 to 150° C. for 15 sec to 300 sec.

The thickness (D) of the primer layer 4 is preferably 1 to 1000 nm, more preferably 1 to 200 nm, still more preferably 5 to 100 nm, and particularly preferably 10 to 80 nm. When the thickness is 1 nm or greater, the film formation after coating becomes stable, and good adhesion can be uniformly obtained. On the other hand, when the thickness is 1000 nm or smaller, the primer layer 4 can be prevented from becoming fragile and stable adhesion with the phosphor layer 7 can be obtained. In addition, it is possible to sufficiently prevent penetration of water vapor and oxygen from the end parts of the primer layer 4 (between the barrier film and the phosphor layer 7). Further, when the thickness of the primer layer 4 is small, the curing reaction of the primer layer 4 proceeds faster, and the initial adhesion to the phosphor layer 7 improves. Furthermore, when the thickness of the primer layer 4 is 200 nm or smaller, optical interference fringes can also be reduced.

The total content of the reactive functional group and the reactive functional group that has reacted with the curable resin per 1 $m^2 \times D$ of the primer layer 4 is $1.5 \times 10^{-6}$ mol or higher and $3.5 \times 10^{-3}$ mol or lower, preferably $2.0 \times 10^{-6}$ mol or higher and $2.0 \times 10^{-3}$ mol or lower, more preferably $3.0 \times 10^{-6}$ mol or higher and $1.0 \times 10^{-3}$ mol or lower, and even more preferably $5.0\times10^{-6}$ mol or higher and $0.5\times10^{-3}$ mol or lower. When the content is no lower than the above-described lower limit, sufficient adhesion with the phosphor layer 7 can be obtained. When the content is no higher than the above-described upper limit, it is possible to prevent the functional group of the curable resin in the phosphor layer 7 for curing from reacting excessively with the reactive functional group, and thus sufficient adhesion with the phosphor layer 7 can be obtained without impeding curing of the curable resin or deteriorating cohesion of the curable resin.

Further, the total content of the reactive functional group and the reactive functional group that has reacted with the curable resin per unit volume (1 cm$^3$) of the primer layer 4 is preferably $1.5\times10^{-3}$ mol/cm$^3$ or higher and $7.0\times10^{-3}$ mol/cm$^3$ or lower, more preferably $2.0\times10^{-3}$ mol/cm$^3$ or higher and $6.5\times10^{-3}$ mol/cm$^3$ or lower, even more preferably $2.5\times10^{-3}$ mol/cm$^3$ or higher and $6.0\times10^{-3}$ mol/cm$^3$ or lower, particularly preferably $3.0\times10^{-3}$ mol/cm$^3$ or higher and $5.5\times10^{-3}$ mol/cm$^3$ or lower. When the content is no lower than the above-described lower limit, sufficient adhesion with the phosphor layer 7 can be obtained. When the content is no higher than the above-described upper limit, it is possible to prevent the functional group of the curable resin in the phosphor layer 7 for curing from reacting excessively with the reactive functional group, and thus sufficient adhesion with the phosphor layer 7 can be obtained without impeding curing of the curable resin or deteriorating cohesion of the curable resin.

The total content of the reactive functional group and the reactive functional group that has reacted with the curable resin per 1 m$^2$×D of the primer layer, and the total content of the reactive functional group and the reactive functional group that has reacted with the curable resin per unit volume (1 cm$^3$) of the primer layer can be calculated from the material composition if the material composition of the primer composition is known. The content can also be determined by analyzing the formed primer layer with XPS (X-ray photoelectron spectroscopy) or TEM (transmission electron microscopy).

The total content of the reactive functional group and the reactive functional group that has reacted with the curable resin per 1 m$^2$×D of the primer layer 4 or per unit volume (1 cm$^3$) of the primer layer corresponds to the content of the unreacted reactive functional groups contained in the primer composition before being coated and before being cured on the phosphor layer 7. A high content of unreacted reactive functional groups in the primer composition facilitates reaction between the reactive functional groups and the curable resin in the phosphor layer 7 during coating and curing. However, it should be noted that when it is too high, the adhesion may deteriorate due to imbalance in the functional groups in the curable resin.

(Mat Layer)

The mat layer 6 is provided on the surface of the barrier film on the side facing away from the primer layer 4 in order to exert one or more optical functions and/or antistatic functions. Examples of the optical functions include a function of preventing interference fringes (moire), an antireflection function, and a diffusing function, but they are not limited to these functions. Among these, the mat layer 6 preferably has at least an interference fringe prevention function as an optical function. In the present embodiment, a case where the mat layer 6 has at least the function of preventing interference fringes will be described.

The mat layer 6 may include a binder resin and fine particles. The fine particles may be embedded in the binder resin in such a manner that the fine particles are partially exposed from the surface of the mat layer 6 so that there are fine irregularities on the surface of the mat layer 6. By providing such a mat layer 6 on the surface of the barrier film, generation of interference fringes such as Newton's rings can be sufficiently prevented, and as a result, a wavelength conversion sheet with high efficiency, high definition, and long life can be obtained.

The binder resin may be a resin having good optical transparency, although it is not limited to this. More specifically, for example, it may be a thermoplastic resin, a thermosetting resin, or an ionizing radiation curable resin; examples include polyester resin, acrylic resin, acrylic urethane resin, polyester acrylate resin, polyurethane acrylate resin, urethane resin, epoxy resin, polycarbonate resin, polyamide resin, polyimide resin, melamine resin, and phenol resin. Instead of an organic resin, a silica binder can also be used. Among these, it is preferable to use an acrylic resin or a urethane resin because of the many options for the material, and it is more preferable to use an acrylic resin because of its good light resistance and optical properties. One or a combination of these can be used.

Examples of the fine particles include inorganic fine particles such as silica, clay, talc, calcium carbonate, calcium sulfate, barium sulfate, titanium oxide, and alumina; and organic fine particles such as styrene resin, urethane resin, silicone resin, acrylic resin, and polyamide resin, but they are not limited to these. Among these, the fine particles are preferably made of silica, acrylic resin, urethane resin, polyamide resin, or the like, with a refractive index of 1.40 to 1.55 considering the light transmittance. Fine particles with a low refractive index are expensive, whereas fine particles with a very high refractive index tend to impair the light transmittance. One or a combination of these can be used.

The average particle diameter of the fine particles is preferably 0.1 to 30 μm, and more preferably 0.5 to 10 μm. When the average particle diameter of the fine particles is equal to or larger than 0.1 μm, a good interference fringe prevention function tends to be obtained, and when it is equal to or smaller than 30 μm, the transparency tends to be further improved. The average particle diameter is a volume average diameter measured by the laser diffraction method.

The content of the fine particles in the mat layer 6 is preferably 0.5 to 30% by mass, relative to the total amount of the mat layer 6, and more preferably 3 to 10% by mass. When the content of the fine particles is 0.5% by mass or greater, the light diffusing function and the effect of preventing occurrence of interference fringes tend to further improve, and when the content is 30% by mass or smaller, reduction of luminance is prevented.

The mat layer 6 can be formed by applying a coating solution containing the binder resin and fine particles described above onto the surface of the first film 1, the second film 2, or the third film 3 and curing it by drying. The method of applying the solution may be a coating method performed with, for example, a gravure coater, a dip coater, a reverse coater, a wire bar coater, a die coater, or the like.

The thickness of the mat layer 6 is preferably 0.1 to 20 μm, more preferably 0.3 to 10 μm. When the thickness of the mat layer 6 is 0.1 μm or greater, a uniform film tends to be obtained, and a sufficient optical function tends to be obtained. On the other hand, when the thickness of the mat layer 6 is 20 μm or smaller, in the case fine particles are used in the mat layer 6, the fine particles tend to be exposed to the surface of the mat layer 6 and the unevenness imparting effect tends to be obtained.

(Phosphor Layer)

The phosphor layer 7 is a layer having a wavelength conversion function for receiving excitation light and emitting light of a different wavelength, and includes at least one kind of phosphor (not shown). The phosphor layer 7 contains a curable resin.

Preferable phosphors are nano-sized semiconductors called quantum dots as they provide high wavelength conversion efficiency as well as good luminance, and good color reproducibility as a display. The quantum dots may be those that comprise a core as the light emission part covered with a shell as a protective film. An example of the core is cadmium selenide (CdSe), and an example of the shell is zinc sulfide (ZnS). Since the surface defects of the CdSe particles are covered with ZnS having a large band gap, the quantum efficiency can be improved. Further, the phosphor may have a structure in which the core is doubly covered with a first shell and a second shell. In this case, it is possible to use CdSe for the core, zinc selenide (ZnSe) for the first shell and ZnS for the second shell. A combination of two or more of the above kinds of phosphors may be used. It is also possible to laminate a phosphor layer only including a single kind of phosphor with a phosphor layer only including another kind of phosphor.

The quantum dots are dispersed in a resin material for sealing. The resin material comprises at least a curable resin. The curable resin is preferably a resin that can be cured with ultraviolet light and/or cured thermally. The curable resin preferably includes at least one selected from the group consisting of acrylic resin, thiol resin, and epoxy resin. When the phosphor layer 7 comprises one or more of acrylic resin, thiol resin, and epoxy resin, particularly good adhesion can be obtained with the primer layer 4 including a silane coupling agent with a reactive functional group capable of reacting with these resins. Examples of resin materials other than acrylic resin, thiol resin, and epoxy resin, include polyvinyl butyral resin, polyvinyl acetal resin, phenol resin, melamine resin, and other ink paste binder resins. In addition, for example, it is also possible to use adhesive materials listed below that also function as a binder resin. Examples of an adhesive material that also functions as a binder resin include a urea resin type, melamine resin type, phenol resin type, resorcinol resin type, epoxy resin type, polyurethane resin type, polyimide type, polybenzimidazole type, polyester resin type, vinyl acetate resin type, polyvinyl acetal type, polyvinyl alcohol type, vinyl chloride resin type, cyanoacrylate type, polyether acrylate type, polyethylene type, cellulose type, chloroprene rubber type, nitrile rubber type, SBR type, SIS type, polysulfide type, butyl rubber type, silicone rubber type, vinyl phenolic, epoxy phenolic, chloroprene phenolic, nitrile phenolic, nylon epoxy, and nitrile epoxy. The resin materials may be used singly or in combination of two or more kinds.

The phosphor layer 7 can be formed by applying a mixed solution of a phosphor and a resin material, and if necessary, a solvent onto the primer layer 4 of the barrier film to form a coating film, and then, if necessary, laminating another barrier film formed separately such that the primer layer 4 faces the phosphor layer 7, and curing the coating film. Although the conditions for the curing of the coating film are not limited, for example, curing may be carried out at 15 to 100° C. for 10 minutes to 24 hours.

The wavelength conversion sheet of the present embodiment described above can be used, for example, in a backlight unit. The backlight unit includes, for example, a light source, a light guide plate, a reflector plate, and the wavelength conversion sheet of the present embodiment. In the backlight unit, the light guide plate and the reflector plate are placed on one of the surfaces of the wavelength conversion sheet in this order, and the light source is disposed on a lateral side of the light guide plate (in the direction of the plane of the light guide plate). For example, a blue light emitting diode element or the like is used as the light source.

[Method of Manufacturing Wavelength Conversion Sheet]

Next, the method of manufacturing the color conversion sheet of this embodiment will be described. According to the method of manufacturing the wavelength conversion sheet of the present embodiment, the wavelength conversion sheet comprises a phosphor layer including a curable resin and a phosphor, and a barrier film laminated on at least one surface of the phosphor layer, the barrier film having a primer layer on its outermost surface facing the phosphor layer. The method comprises: applying, onto a lower layer of the primer layer in the barrier film, a primer composition containing a silane coupling agent having a reactive functional group capable of reacting with the curable resin, other than an alkoxysilane group and a silanol group, and curing it to form the primer layer; and laminating the phosphor layer with the barrier film. The lower layer of the primer layer in the barrier film is the first substrate 11 in the barrier films 50, 70, 55 shown in FIGS. 1, 3, and 5, and the gas barrier coating layer 14 in the barrier film 60, 80, 85 shown in FIGS. 2, 4, and 6.

The primer layer formed by the manufacturing method of the present embodiment satisfies the requirements for the primer layer in the wavelength conversion sheet of the present embodiment described above. That is, assuming that the thickness of the primer layer is D, the total content, per $1\ m^2 \times D$ of the primer layer, of the reactive functional group and the reactive functional group that has reacted with the curable resin is $1.5 \times 10^{-6}$ mol or higher and $3.5 \times 10^{-3}$ mol or lower. The total content of the reactive functional group and the reactive functional group that has reacted with the curable resin can be adjusted by the thickness of the primer layer, the concentration of the reactive functional group in the primer composition, etc.

In the case of producing the wavelength conversion sheet 100 shown in FIG. 1, it may be produced by the following process. Note that the method of forming each layer is as described above. First, the first film 1 and the second film 2 are prepared. That is, the anchor coat layer 12 is formed on the first substrate 11, and the inorganic thin film layer 13 and the gas barrier coating layer 14 are sequentially formed thereon to prepare the first film 1. The second film 2 can be prepared similarly.

An adhesive or a pressure-sensitive adhesive is applied on the gas barrier coating layer 14 of the first film 1 thus obtained, and the first film is bonded to the surface of the second film 2 on the gas barrier coating layer 24 side. After aging them, a laminate film comprising the first film 1 and the second film 2 bonded together via the adhesive layer 5 is obtained. The bonding can be performed using a general laminating device. Note that the adhesive or pressure-sensitive adhesive may be applied onto the gas barrier coating layer 24 of the second film 2.

A primer composition containing a silane coupling agent having a reactive functional group capable of reacting with the curable resin, other than an alkoxysilane group and a silanol group, is applied onto the first substrate 11 of the laminate film thus obtained, and then cured to form the primer layer 4. Further, the mat layer 6 is formed on the second substrate 21 of the laminate film. The order of forming the primer layer 4 and the mat layer 6 is not limited.

The mat layer 6 may be formed on the second substrate 21 of the second film 2 in advance before the first film 1 and the second film 2 are bonded with each other. Further, the primer layer 4 may be formed on the first substrate 11 of the first film 1 in advance before the first film 1 and the second film 2 are bonded with each other. The barrier film 50 is thus obtained. Two barrier films 50 are prepared.

Next, a mixed solution comprising a phosphor and a resin material containing a curable resin, and if necessary, also comprising a solvent is applied onto the primer layer 4 of one barrier film 50 to form a coating film. Then, the primer layer 4 side of the other barrier film 50 is bonded thereto, and the coating film is cured to form the phosphor layer 7. At the time of forming the phosphor layer 7, the reactive functional group comprised in the primer layer 4 reacts with the curable resin comprised in the coating film, and good adhesion between the primer layer 4 and the phosphor layer 7 is obtained. According to the above method, it is possible to obtain the wavelength conversion sheet 100 of the present embodiment having good gas barrier properties and good adhesion between the barrier films 50 and the phosphor layer 7.

Preferable embodiments of the present invention have been described in detail above. However, the technical scope of the present invention is not limited to the above-described embodiments, and various modifications may be made without departing from the spirit of the present invention.

For example, in the wavelength conversion sheets shown in FIGS. 1 to 6, the mat layer 6 and the anchor coat layers 12 and 22 may not be provided.

Further, in the wavelength conversion sheets 100, 200, 500 shown in FIGS. 1, 2, and 5, the barrier layers 15, 25 may have a structure in which a plurality of inorganic thin film layers 13, 23 and gas barrier coating layers 14, 24 are laminated alternately. Further, in the wavelength conversion sheets 300, 400, 600 shown in FIGS. 3, 4, and 6, the barrier layers 15, 25 may have a structure in which one inorganic thin film layer 13, 23 and one gas barrier coating layer 14, 24 are laminated.

In the wavelength conversion sheets shown in FIGS. 1 to 6, the orientations of the first film 1 and the second film 2 are not limited to those illustrated, and they may be arranged in the opposite orientations.

The barrier films shown in FIGS. 1 to 6 may further comprise, in addition to the first to third films shown in their respective drawings, one or more films having the same or different structures as them.

In the wavelength conversion sheets shown in FIGS. 1 to 6, the pair of barrier films sandwiching the phosphor layer 7 may have different configurations. The mat layer 6 does not need to be provided on both sides of the wavelength conversion sheet, and instead it may be provided on only one surface.

EXAMPLES

In the following, the present invention will be specifically described with reference to examples and comparative examples. However, the present invention is not limited thereto.

In the following examples and comparative examples, the water vapor transmission rate was measured using a water vapor transmission rate measuring device (trade name: Permatran, manufactured by MOCON) by an infrared sensor method according to JIS K7129. The temperature of the transmission cell was set to 40° C., the relative humidity of the high humidity chamber was set to 90% RH, and the relative humidity of the low humidity chamber was set to 0% RH. The measured results of the water vapor transmission rates of the wavelength conversion sheets produced in the examples and comparative examples are shown in Tables 1 and 2.

Further, in the following examples and comparative examples, the thickness of the primer layer was measured by observing the cross section of the sample with transmission electron microscopy (TEM).

Example 1

A biaxially oriented polyethylene terephthalate film (trade name: P60, thickness: 16 μm, manufactured by Toray Industries, Inc.) with a surface subjected to corona discharge treatment was prepared, and a polyester resin solution was applied by the bar coating method onto the surface subjected to corona discharge treatment. Then the coating was cured by drying at 80° C. for 1 minute, and an anchor layer with a thickness of 100 nm was formed.

Using a vacuum evaporation device of the electron beam heating type, a silicon oxide material (manufactured by Canon Optron, Inc.) was evaporated by electron beam heating under a pressure of $1.5 \times 10^{-2}$ Pa to form a SiOx film with a thickness of 80 nm as the inorganic thin film layer on the anchor coat layer. The acceleration voltage in evaporation was 40 kV, and the emission current was 0.2 A. A coating solution comprising a hydrolyzate of tetraethoxysilane (containing a siloxane bond) and polyvinyl alcohol at a mass ratio of 1:1 was applied onto the SiOx film by the bar coating method, and cured by drying at 120° C. for 1 minute. As a result, a gas barrier coating layer with a thickness of 400 nm was formed. Thus, the first film was obtained. The second film was produced in the same manner as the first film. The water vapor transmission rate of the first and second films was 0.1 g/(m²·day).

A pressure-sensitive adhesive (main agent: TPO-3183, curing agent: K-341, manufactured by SAIDEN CHEMICAL INDUSTRY CO., LTD.) was applied onto the gas barrier coating layer of the first film to form an adhesive layer, and the gas barrier coating layer of the second film was bonded thereto. After that, aging was performed at 25° C. for 7 days. Thus, a laminate film comprising the first film and the second film bonded together via the adhesion layer was obtained. The thickness of the adhesive layer was 4 μm.

A primer layer was formed by the following method on the polyethylene terephthalate film (first substrate) of the first film in the obtained laminate film.

A primer composition, obtained by diluting 3-methacryloxypropyltrimethoxysilane (a methacrylic silane coupling agent, manufactured by Shin-Etsu Chemical Co., Ltd., trade name: KBM-503) to a solid content of 0.05% by mass using ethyl acetate, was applied onto the first substrate of the first film with a wire bar #3. Then, it was cured by drying at 120° C. for 1 minute to form a primer layer with a thickness (D) of 1 nm. The content of the reactive functional group per 1 $m^2 \times D$ of the obtained primer layer and the content of the reactive functional group per unit volume (1 $cm^3$) of the primer layer were calculated based on the raw material composition of the primer composition and the thickness of the primer layer. That is, the mass per 1 $m^{2 \times 1}$ nm of the primer layer solely consisting of KBM-503 (molecular weight: 248.4, specific gravity: 1) is $1 \times 10^{-3}$ g, and by dividing this by the molecular weight, it can be calculated that the content of the reactive functional group per 1 $m^{2 \times 1}$ nm of the primer layer is $4.0 \times 10^{-6}$ mol. In addition, the mass per 1 $cm^3$ of the primer layer is 1 g, and by dividing this by the molecular weight, it can be calculated that the content of the reactive functional group per unit volume of the primer layer is $4.0 \times 10^{-3}$ mol/cm$^3$.

Further, 100 parts by mass of an acrylic polyol resin (manufactured by DIC, trade name: ACRYDIC A-814), 8.5 parts by mass of an isocyanate curing agent (manufactured by DIC, trade name: BURNOCK DN-980, a hexamethylene diisocyanate compound), 10 parts by mass of fine particles (polyurethane, average particle diameter: 2 μm), and 70 parts by mass of solvent (ethyl acetate) were applied onto the polyethylene terephthalate film (the second substrate) of the second film, and then cured by drying them with heat to form a mat layer with a thickness of 3 μm. The barrier film was thus obtained. Two barrier films having the same configuration were produced.

A material comprising an acrylic resin (as a thermosetting resin) and quantum dot light emitters dispersed therein with a particle diameter of 6 nm and whose core is cadmium selenide (CdSe) and shell is zinc sulfide (ZnS) was dropped onto the primer layer of one of the barrier films, and the primer layer of the other barrier film was bonded thereto. The acrylic resin used here as the thermosetting resin was one obtained by mixing an acrylic polyol resin (trade name: UH-2000) manufactured by Toagosei Co., Ltd. as the main agent of the acrylic resin and DN-902S (trade name) manufactured by DIC as the curing agent at a mass ratio of 10:1.

The thermosetting resin was left at room temperature for 24 hours for curing to form a phosphor layer having a wavelength conversion function. Thus, a wavelength conversion sheet having the configuration shown in FIG. 1 was obtained. The thickness of the phosphor layer was 100 μm.

Examples 2 to 4 and Comparative Examples 1 to 2

The wavelength conversion sheets were obtained in the same manner as in Example 1 except that the type of the curable resin used for the phosphor layer and/or the thickness of the primer layer were changed as shown in Table 1. In the table, the thiol resin is one that is obtained by mixing QE-340M (trade name) manufactured by Toray Industries, Inc., which is a thiol resin as the main agent, and an acrylic monomer as the curing agent (trade name: TMP-3 manufactured by DKS Co. Ltd.) at a mass ratio of 8:2, and the epoxy resin is one that is obtained by mixing Epikote 828 (trade name) manufactured by JER, which is an epoxy resin as the main agent, and ST12 (trade name) manufactured by JER as the curing agent at a mass ratio of 9:1. Further, in the case where the thickness of the primer layer was 100 nm, a primer composition which had been adjusted to have a solid content of 5% by mass was applied using a wire bar #3.

Example 5

A wavelength conversion sheet was obtained in the same manner as in Example 1 except that the primer layer was formed by the following method.

A primer composition with a solid content of 0.05% by mass was prepared by mixing 100 parts by mass of 3-methacryloxypropyltrimethoxysilane (a methacrylic silane coupling agent, manufactured by Shin-Etsu Chemical Co., Ltd., trade name: KBM-503), 100 parts by mass of zirconium tetraacetylacetonate (zirconium chelate, manufactured by Matsumoto Fine Chemical Co., Ltd., trade name: ORGATIX ZC-700, solid content: 20% by mass), and 239800 parts by mass of toluene. The obtained primer composition was applied onto the first substrate of the first film using a wire bar #3, and then cured by drying at 120° C. for 1 minute to form a primer layer having a thickness (D) of 1 nm. The mass of KBM-503 per 1 m$^{2 \times 1}$ nm of the primer layer comprising KBM-503 (molecular weight: 248.4, specific gravity: 1) and ZC-700 (specific gravity: 1) is $0.83 \times 10^{-3}$ g, and by dividing this by the molecular weight, it can be calculated the content of the reactive functional group per 1 m$^{2 \times 1}$ nm of the primer layer is $3.4 \times 10^{-6}$ mol. The mass of KBM-503 per 1 cm$^3$ or the primer layer is 0.83 g, and by dividing this by the molecular weight, it can be calculated that the content of the reactive functional group per unit volume of the primer layer is $3.4 \times 10^{-3}$ mol/cm$^3$.

Examples 6 to 10 and Comparative Examples 3 to 5

The wavelength conversion sheets were obtained in the same manner as in Example 5 except that the type of the thermosetting resin used for the phosphor layer and/or the thickness of the primer layer were changed as shown in Table 1. In the case where the thickness of the primer layer was 100 nm, a primer composition adjusted to have a solid content of 5% by mass was applied using a wire bar #3, and in the case where it was 1000 nm, a primer composition adjusted to have a solid content of 25% by mass and a wire bar #6 were used.

Comparative Example 6

A wavelength conversion sheet was obtained in the same manner as in Example 1 except that the primer layer was formed by the following method.

A primer composition, obtained by diluting 3-aminopropyltriethoxysilane (an amine-based silane coupling agent, manufactured by Shin-Etsu Chemical Co., Ltd., trade name: KBE-903) with ethyl acetate to have a solid content of 5% by mass, was applied onto the first substrate of the first film using a wire bar #3, and cured by drying at 120° C. for 1 minute to form a primer layer having a thickness (D) of 100 nm. Since KBE-903 has a molecular weight of 221.4 and specific gravity of 1, it can be calculated that the content of the reactive functional group per 1 m$^{2 \times 100}$ nm of the primer layer is $4.5 \times 10^{-4}$ mol, and the content of the reactive functional group per unit volume of the primer layer is $4.5 \times 10^{-3}$ mol/cm$^3$.

Comparative Example 7 and Example 11

The wavelength conversion sheets were obtained in the same manner as in Comparative Example 6 except that the type of the thermosetting resin used for the phosphor layer was changed as shown in Table 1.

Comparative Example 8

A wavelength conversion sheet was obtained in the same manner as in Example 1 except that the primer layer was formed by the following method.

A primer composition with a solid content of 5% by mass was prepared by mixing 100 parts by mass of 3-aminopropyltriethoxysilane (an amine-based silane coupling agent, manufactured by Shin-Etsu Chemical Co., Ltd., trade name: KBE-903), 100 parts by mass of zirconium tetraacetylacetonate (zirconium chelate, manufactured by Matsumoto Fine Chemical Co., Ltd., trade name: ORGATIX ZC-700, solid content: 20% by mass), and 2200 parts by mass of toluene. The obtained primer composition was applied onto the first substrate of the first film using a wire bar #3, and then cured by drying at 120° C. for 1 minute to form a primer layer having a thickness (D) of 100 nm. Since KBE-903 has a molecular weight of 221.4 and specific gravity of 1, it can be calculated that the content of the reactive functional group per 1 $m^{2\times 100}$ nm of the primer layer is $3.8\times 10^{-4}$ mol, and the content of the reactive functional group per unit volume of the primer layer is $3.8\times 10^{-3}$ mol/cm$^3$.

Comparative Example 9 and Example 12

The wavelength conversion sheets were obtained in the same manner as in Comparative Example 8 except that the type of the thermosetting resin used for the phosphor layer was changed as shown in Table 1.

Example 13

A wavelength conversion sheet was obtained in the same manner as in Example 1 except that the primer layer was formed by the following method.

A primer composition, obtained by diluting 3-mercaptopropylmethyldimethoxysilane (a mercapto-based silane coupling agent, manufactured by Shin-Etsu Chemical Co., Ltd., trade name: KBM-802) with ethyl acetate to have a solid content of 5% by mass, was applied onto the first substrate of the first film using a wire bar #3, and cured by drying at 120° C. for 1 minute to form a primer layer having a thickness (D) of 100 nm. Since KBM-802 has a molecular weight of 180.3 and specific gravity of 1, it can be calculated that the content of the reactive functional group per 1 $m^{2\times 100}$ nm of the primer layer is $5.5\times 10^{-4}$ mol, and the content of the reactive functional group per unit volume of the primer layer is $5.5\times 10^{-3}$ mol/cm$^3$.

Examples 14 and 15

The wavelength conversion sheets were obtained in the same manner as in Example 13 except that the type of the thermosetting resin used for the phosphor layer was changed as shown in Table 2.

Comparative Example 10

A wavelength conversion sheet was obtained in the same manner as in Example 1 except that the primer layer was formed by the following method.

A primer composition, obtained by diluting 3-methacryloxypropyltrimethoxysilane (a methacrylic silane coupling agent, manufactured by Shin-Etsu Chemical Co., Ltd., trade name: KBM-503) to a solid content of 0.005% by mass using ethyl acetate, was applied onto the first substrate of the first film with a wire bar #3. Then, it was cured by drying at 120° C. for 1 minute to form a primer layer with a thickness (D) of 0.1 nm. Since KBM-503 has a molecular weight of 248.4 and specific gravity is 1, it can be calculated that the content of the reactive functional group per 1 $m^{2\times 0.1}$ nm of the primer layer is $4.0\times 10^{-7}$ mol, and the content of the reactive functional group per unit volume of the primer layer is $4.0\times 10^{-3}$ mol/cm$^3$.

Comparative Examples 11 to 15

The wavelength conversion sheets were obtained in the same manner as in Comparative Example 10 except that the type of the curable resin used for the phosphor layer and/or the thickness of the primer layer were changed as shown in Table 2. In the case where the thickness of the primer layer was 1000 nm, a primer composition which had been adjusted to have a solid content of 25% by mass was applied using a wire bar #6.

Comparative Example 16

A wavelength conversion sheet was obtained in the same manner as in Example 1 except that the primer layer was formed by the following method.

A primer composition with a solid content of 25% by mass was prepared by mixing 100 parts by mass of 3-methacryloxypropyltrimethoxysilane (a methacrylic silane coupling agent, manufactured by Shin-Etsu Chemical Co., Ltd., trade name: KBM-503), 100 parts by mass of zirconium tetraacetylacetonate (zirconium chelate, manufactured by Matsumoto Fine Chemical Co., Ltd., trade name: ORGATIX ZC-700, solid content: 20% by mass), and 280 parts by mass of toluene. The obtained primer composition was applied onto the first substrate of the first film using a wire bar #12, and then cured by drying at 120° C. for 1 minute to form a primer layer having a thickness (D) of 2000 nm. Since KBM-503 has a molecular weight of 248.4 and specific gravity of 1, it can be calculated that the content of the reactive functional group per 1 $m^{2\times 2000}$ nm of the primer layer is $6.7\times 10^{-3}$ mol, and the content of the reactive functional group per unit volume of the primer layer is $3.4\times 10^{-3}$ mol/cm$^3$.

Comparative Examples 17 to 18

The wavelength conversion sheets were obtained in the same manner as in Comparative Example 16 except that the type of the thermosetting resin used for the phosphor layer was changed as shown in Table 2.

Example 16

A wavelength conversion sheet was obtained in the same manner as in Example 1 except that the primer layer was formed by the following method.

A primer composition with a solid content of 0.05% by mass was prepared by mixing 100 parts by mass of 3-methacryloxyoctyltrimethoxysilane (a methacrylic silane coupling agent, manufactured by Shin-Etsu Chemical Co., Ltd., trade name: KBM-5803), 500 parts by mass of zirconium tetraacetylacetonate (zirconium chelate, manufactured by Matsumoto Fine Chemical Co., Ltd., trade name: ORGATIX ZC-700, solid content: 20% by mass), and 399400 parts by mass of toluene. The obtained primer composition was applied onto the first substrate of the first film using a wire bar #3, and then cured by drying at 120° C. for 1 minute to form a primer layer having a thickness (D) of 1 nm. Since KBM-5803 has a molecular weight of 318 and specific gravity of 1, it can be calculated that the content of the reactive functional group per 1 $m^{2\times 1}$ nm of the primer layer is $1.6\times 10^{-6}$ mol, and the content of the reactive functional group per unit volume of the primer layer is $1.6\times 10^{-3}$ mol/cm$^3$.

Examples 17 to 19 and Comparative Examples 19 to 20

The wavelength conversion sheets were obtained in the same manner as in Example 16 except that the type of the thermosetting resin used for the phosphor layer and/or the thickness of the primer layer were changed as shown in Table 2. In the case where the thickness of the primer layer was 100 nm, a primer composition which had been adjusted to have a solid content of 5% by mass was applied using a wire bar #3.

Example 20

A wavelength conversion sheet was obtained in the same manner as in Example 1 except that the primer layer was formed by the following method.

A primer composition, obtained by diluting vinyltrimethoxysilane (a vinyl-based silane coupling agent, manufactured by Shin-Etsu Chemical Co., Ltd., trade name: KBM-1003) with ethyl acetate to have a solid content of 5% by mass, was applied onto the first substrate of the first film using a wire bar #3, and cured by drying at 120° C. for 1 minute to form a primer layer having a thickness (D) of 100 nm. Since KBM-1003 has a molecular weight of 148.2 and specific gravity of 1, it can be calculated that the content of the reactive functional group per 1 m$^2$×100 nm of the primer layer is 6.7×10$^{-4}$ mol, and the content of the reactive functional group per unit volume of the primer layer is 6.7×10$^{-3}$ mol/cm$^3$.

Examples 21 to 23 and Comparative Examples 21 to 22

The wavelength conversion sheets were obtained in the same manner as in Example 20 except that the type of the thermosetting resin used for the phosphor layer and/or the thickness of the primer layer were changed as shown in Table 2. Further, in the case where the thickness of the primer layer was 500 nm, a primer composition which had been adjusted to have a solid content of 25% by mass was applied using a wire bar #3.

<Evaluation of Adhesion>

The wavelength conversion sheets obtained in the examples and comparative examples were cut into strips with a width of 1 cm, and the cut wavelength conversion sheets were fixed on a glass plate. Each of the primer layers of the fixed strips of wavelength conversion sheets was peeled off from the phosphor layer at a speed of 300 mm/min in the direction perpendicular to the glass plate using the TENSILON universal material tester (manufactured by A & D Co., Ltd.), and the strength required for the peeling was measured. The measurement results are shown in Tables 1 and 2.

TABLE 1

| | | Primer layer | | | | | | Water vapor |
| | | | | Content of reactive functional group | | Kind of resin | Peeling | transmission |
| | Material | Kind of reactive functional group | Thickness (nm) | per 1 m$^2$ × D (mol) | per unit volume (mol/cm$^3$) | in phosphor layer | strength (N/cm) | rate (mg/ (m$^2$ · day)) |
|---|---|---|---|---|---|---|---|---|
| Example 1 | KBM-503 | Methacrylic group | 1 | 4.0 × 10$^{-6}$ | 4.0 × 10$^{-3}$ | Acrylic resin | 5.0 | 4 |
| Example 2 | | | | | | Thiol resin | 4.8 | 4 |
| Comparative Example 1 | | | | | | Epoxy resin | 3.1 | 4 |
| Example 3 | | | 100 | 4.0 × 10$^{-4}$ | 4.0 × 10$^{-3}$ | Acrylic resin | 5.3 | 3 |
| Example 4 | | | | | | Thiol resin | 5.1 | 3 |
| Comparative Example 2 | | | | | | Epoxy resin | 3.0 | 3 |
| Example 5 | KBM-503/ZC-700 (Mass ratio 100/100) | Methacrylic group | 1 | 3.4 × 10$^{-6}$ | 3.4 × 10$^{-3}$ | Acrylic resin | 7.2 | 3 |
| Example 6 | | | | | | Thiol resin | 7.4 | 3 |
| Comparative Example 3 | | | | | | Epoxy resin | 2.8 | 3 |
| Example 7 | | | 100 | 3.4 × 10$^{-4}$ | 3.4 × 10$^{-3}$ | Acrylic resin | 8.0 | 4 |
| Example 8 | | | | | | Thiol resin | 7.9 | 4 |
| Comparative Example 4 | | | | | | Epoxy resin | 3.3 | 4 |
| Example 9 | | | 1000 | 3.4 × 10$^{-3}$ | 3.4 × 10$^{-3}$ | Acrylic resin | 7.7 | 3 |
| Example 10 | | | | | | Thiol resin | 7.8 | 3 |
| Comparative Example 5 | | | | | | Epoxy resin | 3.2 | 3 |
| Comparative Example 6 | KBE-903 | Amino group | 100 | 4.5 × 10$^{-4}$ | 4.5 × 10$^{-3}$ | Acrylic resin | 1.6 | 3 |
| Comparative Example 7 | | | | | | Thiol resin | 1.1 | 3 |
| Example 11 | | | | | | Epoxy resin | 5.7 | 3 |
| Comparative Example 8 | KBE-903/ZC-700 (Mass ratio 100/100) | Amino group | 100 | 3.8 × 10$^{-4}$ | 3.8 × 10$^{-3}$ | Acrylic resin | 1.8 | 4 |
| Comparative Example 9 | | | | | | Thiol resin | 1.0 | 4 |
| Example 12 | | | | | | Epoxy resin | 6.2 | 4 |

TABLE 2

| | | Primer layer | | | | | | Water vapor |
| | | | | Content of reactive functional group | | Kind of resin | Peeling | transmission |
| | Material | Kind of reactive functional group | Thickness (nm) | per 1 m$^2$ × D (mol) | per unit volume (mol/cm$^3$) | in phosphor layer | strength (N/cm) | rate (mg/ (m$^2$ · day)) |
|---|---|---|---|---|---|---|---|---|
| Example 13 | KBM-802 | Mercapto group | 100 | 5.5 × 10$^{-4}$ | 5.5 × 10$^{-3}$ | Acrylic resin | 6.3 | 4 |
| Example 14 | | | | | | Thiol resin | 5.9 | 4 |

TABLE 2-continued

| | Primer layer | | | | | | Water vapor |
|---|---|---|---|---|---|---|---|
| | | | Content of reactive functional group | | Kind of resin | Peeling | transmission |
| | Material | Kind of reactive functional group | Thickness (nm) | per 1 m² × D (mol) | per unit volume (mol/cm³) | in phosphor layer | strength (N/cm) | rate (mg/ (m² · day)) |
| Example 15 | | | | | | Epoxy resin | 5.7 | 4 |
| Comparative Example 10 | KBM-503 | Methacrylic group | 0.1 | $4.0 \times 10^{-7}$ | $4.0 \times 10^{-3}$ | Acrylic resin | 1.9 | 4 |
| Comparative Example 11 | | | | | | Thiol resin | 1.6 | 4 |
| Comparative Example 12 | | | | | | Epoxy resin | 0.8 | 4 |
| Comparative Example 13 | | | 1000 | $4.0 \times 10^{-3}$ | $4.0 \times 10^{-3}$ | Acrylic resin | 2.0 | 4 |
| Comparative Example 14 | | | | | | Thiol resin | 1.8 | 4 |
| Comparative Example 15 | | | | | | Epoxy resin | 1.3 | 4 |
| Comparative Example 16 | KBM-503/ZC-700 (Mass ratio 100/100) | Methacrylic group | 2000 | $6.7 \times 10^{-3}$ | $3.4 \times 10^{-3}$ | Acrylic resin | 2.4 | 3 |
| Comparative Example 17 | | | | | | Thiol resin | 2.5 | 3 |
| Comparative Example 18 | | | | | | Epoxy resin | 2.1 | 3 |
| Example 16 | KBM-5803/ZC-700 (Mass ratio 100/500) | Methacrylic group | 1 | $1.6 \times 10^{-6}$ | $1.6 \times 10^{-3}$ | Acrylic resin | 7.4 | 4 |
| Example 17 | | | | | | Thiol resin | 7.5 | 4 |
| Comparative Example 19 | | | | | | Epoxy resin | 2.2 | 4 |
| Example 18 | | | 100 | $1.6 \times 10^{-4}$ | $1.6 \times 10^{-3}$ | Acrylic resin | 7.2 | 4 |
| Example 19 | | | | | | Thiol resin | 7.2 | 4 |
| Comparative Example 20 | | | | | | Epoxy resin | 2.3 | |
| Example 20 | KBM-1003 | Vinyl group | 100 | $6.7 \times 10^{-4}$ | $6.7 \times 10^{-3}$ | Acrylic resin | 7.5 | 3 |
| Example 21 | | | | | | Thiol resin | 7.8 | 3 |
| Comparative Example 21 | | | | | | Epoxy resin | 2.9 | 3 |
| Example 22 | | | 500 | $3.4 \times 10^{-3}$ | $6.7 \times 10^{-3}$ | Acrylic resin | 7.7 | 3 |
| Example 23 | | | | | | Thiol resin | 7.8 | 3 |
| Comparative Example 22 | | | | | | Epoxy resin | 2.8 | 3 |

As can be seen from the results shown in Table 1 and Table 2, the wavelength conversion sheets of the examples have good gas barrier properties and, in comparison with the wavelength conversion sheets of the comparative examples, they have good adhesion between the barrier film and the phosphor layer.

INDUSTRIAL APPLICABILITY

The optical laminate of the present invention can be suitably applied to wavelength conversion sheets (color conversion members) containing light emitters and used in backlights for liquid crystal displays that require barrier properties related to transmission of oxygen or water vapor, particularly wavelength conversion sheets containing quantum dot light emitters; organic EL devices; solar cells; and other industrial materials.

REFERENCE SIGNS LIST

1 . . . First film; 2 . . . Second film; 3 . . . Third film; 4 . . . Primer layer; 5 . . . Adhesive layer; 6 . . . Mat layer; 7 . . . Phosphor layer; 11 . . . First substrate; 21 . . . Second substrate; 31 . . . Third substrate; 12, 22 . . . Anchor coat layer; 13, 23 . . . Inorganic thin film layer; 14, 24 . . . Gas barrier coating layer; 15, 25 . . . Barrier layer; 50, 55, 60, 70, 80, 85 . . . Barrier film; 100, 200, 300, 400, 500, 600 . . . Wavelength conversion sheet (optical laminate).

What is claimed is:

1. A wavelength conversion sheet comprising a phosphor layer including a curable resin and a phosphor, and a barrier film laminated on at least one surface of the phosphor layer, wherein
the barrier film comprises, on an outermost surface facing the phosphor layer, a primer layer formed by curing a primer composition containing a silane coupling agent having a reactive functional group capable of reacting with the curable resin, other than an alkoxysilane group and a silanol group, and
assuming that a thickness of the primer layer is D, a total content of the reactive functional group and the reactive functional group that has reacted with the curable resin per 1 m²×D of the primer layer is $1.5 \times 10^{-6}$ mol or higher and $3.5 \times 10^{-3}$ mol or lower, wherein the curable resin comprises a thiol resin, and the reactive functional group comprises at least one selected from the group consisting of an epoxy group, a mercapto group, a vinyl group, and a methacrylic group.

2. The wavelength conversion sheet of claim 1, wherein the total content of the reactive functional group and the reactive functional group that has reacted with the curable resin per unit volume of the primer layer is $1.5 \times 10^{-3}$ mol/cm³ or higher and $7.0 \times 10^{-3}$ mol/cm³ or lower.

3. A wavelength conversion sheet comprising a phosphor layer including a curable resin and a phosphor, and a barrier film laminated on at least one surface of the phosphor layer, wherein the barrier film comprises, on an outermost surface facing the phosphor layer, a primer layer by curing a primer composition containing a silane coupling agent having a reactive functional group capable of reacting with the curable resin, other than an alkoxysilane group and a silanol group, and assuming that a thickness of the primer layer is D, a total content of the reactive functional group and the reactive functional group that has reacted with the curable resin per 1 $m^2 \times D$ of the primer layer is $1.5 \times 10^{-6}$ mol or higher and $3.5 \times 10^{-3}$ mol or lower, wherein the curable resin comprises an acrylic resin, and the reactive functional group comprises at least one selected from the group consisting of a vinyl group, an acrylic group, a methacrylic group, and a mercapto group.

4. The wavelength conversion sheet of claim 3, wherein the total content of the reactive functional group and the reactive functional group that has reacted with the curable resin per unit volume of the primer layer is $1.5 \times 10^{-3}$ mol/cm$^3$ or higher and $7.0 \times 10^{-3}$ mol/cm$^3$ or lower.

5. A wavelength conversion sheet comprising a phosphor layer including a curable resin and a phosphor, and a barrier film laminated on at least one surface of the phosphor layer, wherein the barrier film comprises, on an outermost surface facing the phosphor layer, a primer layer formed by curing a primer composition containing a silane coupling agent having a reactive functional group capable of reacting with the curable resin, other than an alkoxysilane group and a silanol group, and assuming that a thickness of the primer layer is D, a total content of the reactive functional group and the reactive functional group that has reacted with the curable resin per 1 $m^2 \times D$ of the primer layer is $1.5 \times 10^{-6}$ mol or higher and $3.5 \times 10^{-3}$ mol or lower, wherein the curable resin comprises an epoxy resin, and the reactive functional group comprises at least one selected from the group consisting of an epoxy group, an amino group, and a mercapto group.

6. The wavelength conversion sheet of claim 5, wherein the total content of the reactive functional group and the reactive functional group that has reacted with the curable resin per unit volume of the primer layer is $1.5 \times 10^{-3}$ mol/cm$^3$ or higher and $7.0 \times 10^{-3}$ mol/cm$^3$ or lower.

\* \* \* \* \*